US012732137B2

(12) United States Patent
Schrögendorfer

(10) Patent No.: US 12,732,137 B2
(45) Date of Patent: Sep. 8, 2026

(54) RF AMPLIFIER CIRCUIT WITH A FEEDBACK CIRCUIT AND METHOD FOR ADJUSTING A GAIN MODE OF SAME CIRCUIT

(71) Applicant: Infineon Technologies AG, Neubiberg (DE)

(72) Inventor: Daniel Schrögendorfer, Linz (AT)

(73) Assignee: Infineon Technologies AG, Neubiberg (DE)

( * ) Notice: Subject to any disclaimer, the term of this patent is extended or adjusted under 35 U.S.C. 154(b) by 457 days.

(21) Appl. No.: 18/334,437

(22) Filed: Jun. 14, 2023

(65) Prior Publication Data

US 2023/0421104 A1 Dec. 28, 2023

(30) Foreign Application Priority Data

Jun. 24, 2022 (EP) .................................... 22181082

(51) Int. Cl.
*H03F 1/02* (2006.01)
*H03F 1/52* (2006.01)
(Continued)

(52) U.S. Cl.
CPC ........... *H03F 1/0205* (2013.01); *H03F 1/523* (2013.01); *H03F 1/565* (2013.01); *H03F 3/193* (2013.01);
(Continued)

(58) Field of Classification Search
CPC ........ H03F 1/0205; H03F 1/523; H03F 1/565; H03F 3/193; H03F 2200/165; H03F 2200/222; H03F 2200/451; H03F 2200/294; H03F 1/3205; H03F 1/223; H03F 3/195; H03F 3/72; H03F 2200/111; H03F 2200/156; H03F 2203/7209; H03F 1/26;
(Continued)

(56) References Cited

U.S. PATENT DOCUMENTS 10,320,350 B1 6/2019 Leitner et al.
2004/0239421 A1* 12/2004 Wang .................. H03G 1/0088 330/133

(Continued)

FOREIGN PATENT DOCUMENTS

CN 103107789 A * 5/2013

*Primary Examiner* — Andrea Lindgren Baltzell
*Assistant Examiner* — Jose E Pinero
(74) *Attorney, Agent, or Firm* — Slater Matsil, LLP

(57) ABSTRACT

An RF amplifier circuit includes an amplifier and a feedback circuit. The feedback circuit includes a resistive feedback circuit coupled between an input and output of the amplifier and a shunt feedback circuit coupled between the output of the amplifier and a reference input. The resistive feedback circuit includes a first set of serially coupled resistors and a first set of switches. The first sets of resistors and switches are arranged in a ladder structure with each switch of the first set of switches configured to bypass one of the resistors of the first set of resistors. The shunt feedback circuit includes a second set of serially coupled resistors and a second set of switches. The second sets of resistors and switches are arranged in a ladder structure with each switch of the second set of switches configured to bypass one of the resistors of the second set of resistors.

20 Claims, 14 Drawing Sheets

(51) Int. Cl.
*H03F 1/56* (2006.01)
*H03F 3/193* (2006.01)

(52) U.S. Cl.
CPC .. *H03F 2200/165* (2013.01); *H03F 2200/222* (2013.01); *H03F 2200/451* (2013.01)

(58) Field of Classification Search
CPC ...... H03F 1/32; H03F 3/213; H03F 2200/372; H03F 1/342; H03F 2200/147; H03G 1/0088; H03G 2201/502; H03G 3/3036
USPC .......................................................... 330/291
See application file for complete search history.

(56) References Cited

U.S. PATENT DOCUMENTS

| | | | | |
|---|---|---|---|---|
| 2015/0049883 | A1* | 2/2015 | Ibrahim | H03G 3/22 381/118 |
| 2015/0381123 | A1 | 12/2015 | Wu et al. | |
| 2020/0266778 | A1 | 8/2020 | Ayranci et al. | |
| 2022/0077882 | A1 | 3/2022 | Seong et al. | |
| 2022/0393650 | A1* | 12/2022 | Ayranci | H03F 1/223 |

* cited by examiner

Providing control signals to the switches of the first and second set of switches in order to adjust the gain mode of the RF amplifier circuit

RF AMPLIFIER CIRCUIT WITH A FEEDBACK CIRCUIT AND METHOD FOR ADJUSTING A GAIN MODE OF SAME CIRCUIT

This application claims the benefit of European Patent Application No. 22181082, filed on Jun. 24, 2022, which application is hereby incorporated herein by reference.

TECHNICAL FIELD

Embodiments according to the disclosure are related generally to radio frequency (RF) circuits, and more specifically to RF amplifier circuits with feedback circuits and methods for adjusting a gain mode of the RF amplifier circuit.

BACKGROUND

Recent RF front-end (RFFE) low-noise amplifiers (LNAs) for mobile communication devices are mainly LNAs with an external matching component and a common-source input stage to achieve ultra-low noise figure (NF) with high gain performance. In addition, RFFE LNAs may need to support the so-called "linearity on demand" feature, which may require the implementation of different gain modes.

To support a plurality of applications, a gain performance of 21 dB (e.g. a high gain mode) to −12 dB (e.g. a passive bypass mode) for example in 3 dB steps or even lower may be advantageous or even mandatory. Furthermore, the linearity performance may need to be improved with reduced power gain. If the gain is reduced by 3 dB, the IIP3 (e.g. third order input intercept point) should, for example, be improved by 3 dB or an equal OIP3 (e.g. third order output intercept point) performance for every gain mode should be achieved. The NF performance should, for example, be as low as possible for the high gain mode and can be relaxed with lower power gain.

Due to the reason that modern RFFE mobile communication modules have a high complexity because of a high number or amount of different frequency bands it may, for example, be advantageous that LNA cores support a wide range of frequency bands to reduce developing cycles and also circuit design effort (e.g. LNA-core reusing).

Therefore, novel LNA circuitries may have to perform in different frequency bands with ultra-low RF-performance variation. To achieve the best RF performance, it is advantageous or, for example, even mandatory that the LNAs gain-step implementation has to perform in a similar manner or even equal in every frequency band (e.g. low RF performance variation over frequency).

This may, for example, not be possible with every circuit. It may be necessary to find a solution which is less complex and/or achieves excellent RF performance in a plurality, or for example, even every gain mode (e.g. important or even most important: low influence for the high gain, HG, mode which may, for example, be the most critical mode, e.g. a benchmark gain mode).

Therefore, there is a need for providing gain modes with low power gain variation over different frequency bands, which provides a better compromise between RF performance, linearity, noise figure, chip space, complexity, efficiency and costs.

SUMMARY

Embodiments according to the disclosure comprise a radio frequency, RF, amplifier circuit comprising an amplifier and a feedback circuit. The feedback circuit comprises a resistive feedback circuit, which is coupled between an input of the amplifier and an output of the amplifier, and a shunt feedback circuit, which is coupled between the output of the amplifier and a reference input. The resistive feedback circuit comprises a first set of serially coupled resistors and a first set of switches, wherein the first set of resistors and the first set of switches are arranged in a ladder structure in which each switch of the first set of switches is configured to bypass one of the resistors of the first set of resistors in a closed state thereof. Furthermore, the shunt feedback circuit comprises a second set of serially coupled resistors and a second set of switches, wherein the second set of resistors and the second set of switches are arranged in a ladder structure in which each switch of the second set of switches is configured to bypass one of the resistors of the second set of resistors in a closed state thereof.

Embodiments as described in the present disclosure utilize a feedback circuit, for example a resistive feedback with resistive shunt feedback, e.g. RFB-SFB, to provide a plurality of gain modes, for example by enabling accurate gain reduction, with good linearity and low NF degradation for a plurality of frequencies.

The gain of the RF amplifier circuit may depend on an impedance of the feedback circuit, hence, as an example, by reducing the resistance of the feedback circuit, the gain may be reduced. In addition, an input matching may be improved.

The feedback circuit comprises a resistive feedback circuit, e.g. RFB, and a shunt feedback circuit, e.g. SFB. The circuits comprise sets of switches and sets of resistors, wherein it is to be noted that a set of elements may comprise one, for example single, element and/or a plurality of elements. Usage of a plurality of resistors and corresponding switches in a set may, for example, provide a plurality of impedance configurations to provide a plurality of gain modes, such that for every gain mode an individual impedance of the feedback circuit may be set.

Furthermore, the feedback circuit may provide or enable a band-pass or broadband flat gain performance for a respective gain mode. As an example, the resistive feedback circuit may provide a high pass behavior with respect to gain, when the gain is attenuated and the shunt feedback circuit may provide a low-pass behavior with respect to gain. Hence, the combination of resistive feedback circuit and shunt feedback circuit may provide the band-pass or broadband flat gain performance for a respective gain mode.

In addition, the ladder-structure arrangement of resistive feedback circuit and shunt feedback circuit respectively may provide a good RF performance in the plurality of gain modes. The ladder structure may allow reducing an influence of parasitic capacitances of the respective set of switches, such that parasitic effects may have only a limited or a low impact on the behavior of the amplifier arrangement.

Embodiments according to the disclosure may be based on implementing a variable gain functionality inside an LNA core.

Further embodiments according to the disclosure comprise a method for adjusting a gain mode of the RF amplifier circuit, wherein the method comprises providing control signals to the switches of the first and second set of switches in order to adjust the gain mode of the RF amplifier circuit.

The method as described above is based on the same considerations as the above-described amplifier circuit. The method can, by the way, be completed with all features and functionalities, which are also described with regard to the amplifier circuit.

BRIEF DESCRIPTION OF THE DRAWINGS

The drawings are not necessarily to scale, emphasis instead generally being placed upon illustrating the principles of embodiments of the disclosure. In the following description, various embodiments of the disclosure are described with reference to the following drawings, in which.

DETAILED DESCRIPTION OF ILLUSTRATIVE EMBODIMENTS

Figure 1:
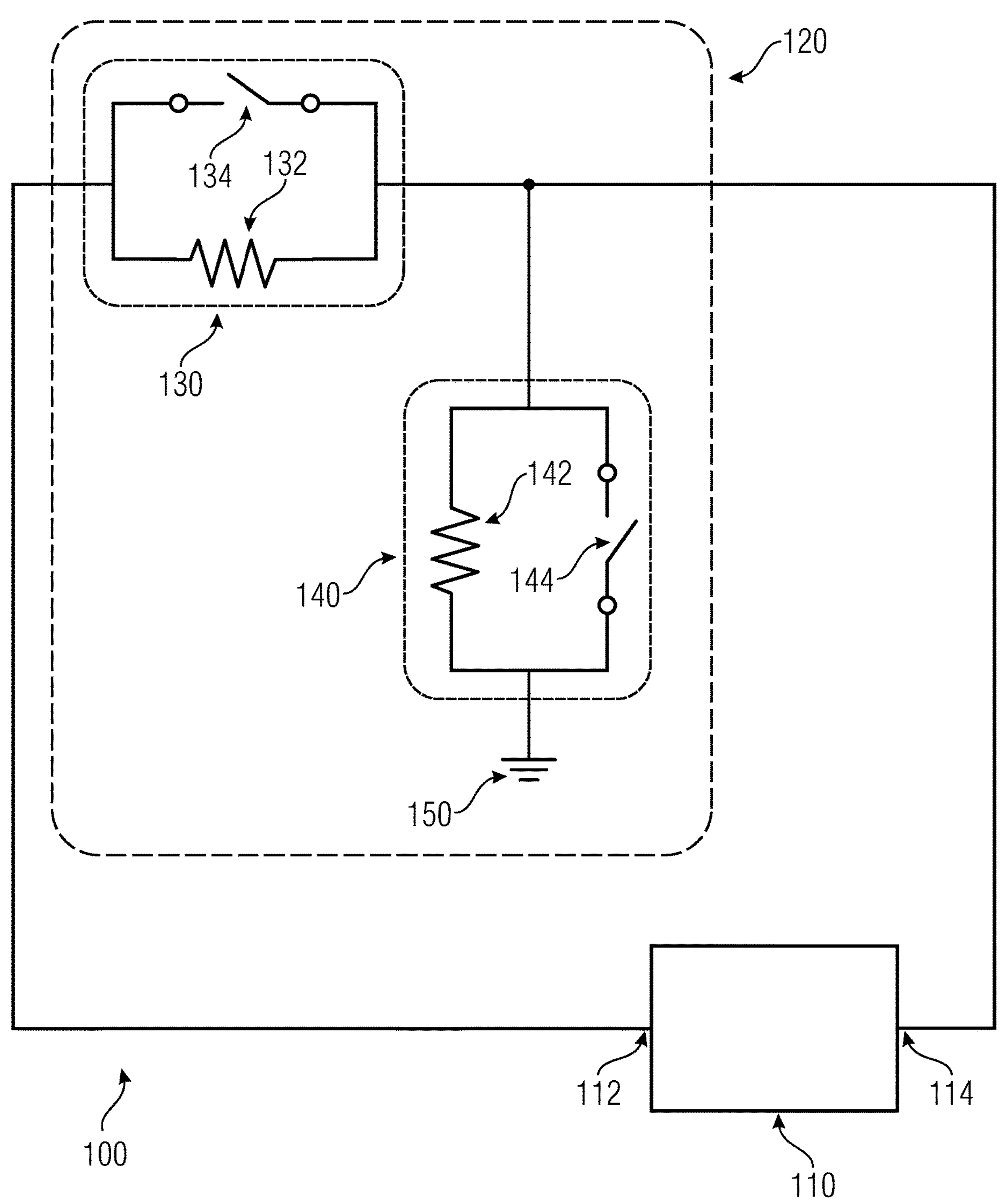
FIG. 1 shows a schematic view of an RF amplifier circuit according to embodiments of the disclosure.

Equal or equivalent elements or elements with equal or equivalent functionality are denoted in the following description by equal or equivalent reference numerals even if occurring in different figures.

In the following description, a plurality of details is set forth to provide a more throughout explanation of embodiments of the present disclosure. However, it will be apparent to those skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described herein after may be combined with each other, unless specifically noted otherwise.

FIG. 1 shows a schematic view of an RF amplifier circuit according to embodiments of the disclosure. FIG. 1 shows RF amplifier circuit 100 comprising an amplifier 110 and a feedback circuit 120. The feedback circuit 120 comprises a resistive feedback circuit 130, which is coupled between an input 112 of the amplifier 110 and an output 114 of the amplifier. Furthermore, the feedback circuit 120 comprises a shunt feedback circuit 140, which is coupled between the output 114 of the amplifier 110 and a reference input 150.

As an example, the amplifier 110 may be any of a Bulk CMOS amplifier, a SOI CMOS amplifier, a bipolar amplifier and/or a BiCMOS amplifier. Optionally, the feedback circuit may be coupled with a drain node of a transistor of the amplifier, the drain node providing an output current of the amplifier. As an example, different input stages for the amplifier may be possible, e.g. common source, single cascode or dual cascode stages.

In general, the amplifier 110 may, as an example, comprise at least one of a cascode, wherein the cascode comprises a common-source stage and a common-gate stage, wherein the drain of the common-source stage is coupled with the source of the common gate stage, and wherein the feedback circuit is coupled with the gate of the common-source stage and with the drain of the common-gate stage; a cascode, wherein the cascode comprises a common-emitter stage and a common-base stage, wherein the collector of the common-emitter stage is coupled with the emitter of the common base stage, and wherein the feedback circuit is coupled with the base of the common-emitter stage and with the collector of the common-base stage; a common-source stage; a common emitter stage; a stage with source degeneration; a stage with a switchable source degeneration; a single cascode stage and a dual cascode stage.

Furthermore, the amplifier circuit 100 may, for example, be configured to address radio frequencies of at least 20 kHz and at most 300 GHz. The reference input (e.g. as well as any of the other reference inputs as described herein) may, for example, be a reference potential, for example ground.

The resistive feedback circuit 130 comprises a first set 132 of serially coupled resistors and a first set 134 of switches, wherein the first set of resistors and the first set of switches are arranged in a ladder structure in which each switch of the first set 134 of switches is configured to bypass one of the resistors of the first set 132 of resistors in a closed state thereof.

As an example, the first set 132 of resistors comprises only a single resistor. Accordingly, the first set 134 of switches comprises only a single switch. However, as explained before, a set of elements may comprise one or more elements. An embodiment, with a plurality of resistors and switches in a respective set is shown and described in the context of FIG. 2.

The shunt feedback circuit 140 comprises a second set 142 of serially coupled resistors and a second set 144 of switches, wherein the second set of resistors and the second set of switches are arranged in a ladder structure in which each switch of the second set 144 of switches is configured to bypass one of the resistors of the second set 142 of resistors in a closed state thereof.

Again, the second sets 142, 144 comprising only one respective element is to be understood as an example according to an embodiment of the disclosure. Furthermore, it is to be noted that the first and second set of resistors may or may not have a corresponding number of resistors and vice versa, the first and second set of switches may or may not have a corresponding number of switches.

Switches of the sets 134 and 144 of switches may, for example, be closed and opened individually or simultaneously in order to adjust an impedance of the feedback circuit 100, in order to provide different gain modes. As an example, closing switches of the sets 134 and 144 may shunt the respective resistors, such that an impedance of the feedback circuit is reduced, in order to reduce a power gain of the amplifier circuit.

Such a gain adaptation may provide good linearity and noise figure characteristics, for example even for RF signals with different frequencies.

Figure 2:
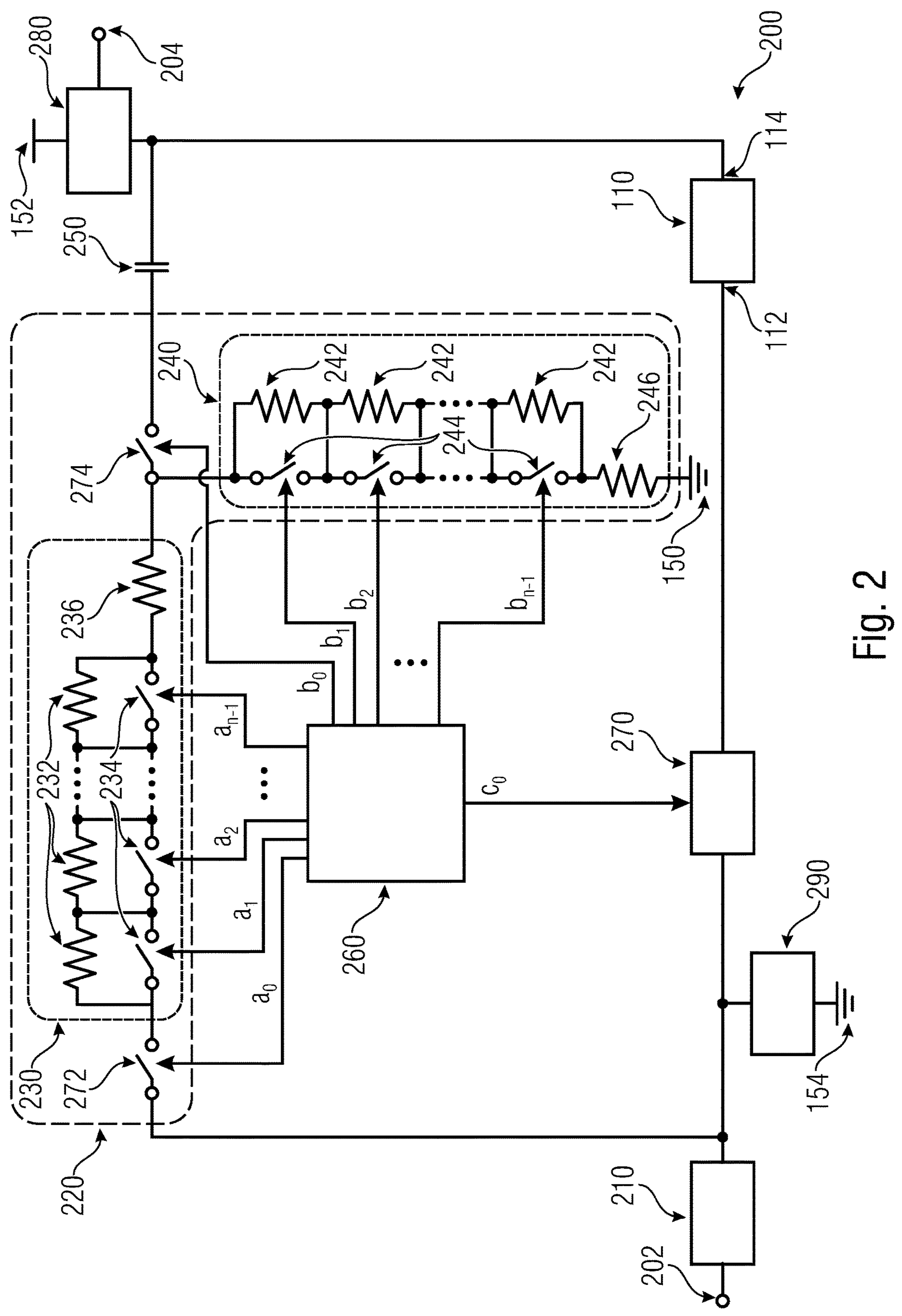
FIG. 2 shows a schematic view of an RF amplifier circuit with additional optional features, according to embodiments of the disclosure.

FIG. 2 shows a schematic view of an RF amplifier circuit with additional optional features, according to embodiments of the disclosure. FIG. 2 shows RF amplifier 200 comprising an amplifier 110 and a feedback circuit 220. The feedback circuit 220 comprises a resistive feedback circuit 230, which is coupled between an input 112 of the amplifier 110 and an output 114 of the amplifier 110, and a shunt feedback circuit 240, which is coupled between the output 114 of the amplifier 110 and a reference input 150.

Resistive feedback circuit 230 comprises a first set 232 of serially coupled resistors and a first set 234 of switches, wherein the first set 232 of resistors and the first set 234 of switches are arranged in a ladder structure in which each switch of the first set 234 of switches is configured to bypass one of the resistors of the first set 232 of resistors in a closed state thereof. As an example, the first set 232 of resistors comprises a plurality of resistors and the first set 234 of switches comprises a corresponding plurality of switches. However, as explained before, optionally the circuit 230 may comprise some resistors without a corresponding switch.

Shunt feedback circuit 240 comprises a second set 242 of serially coupled resistors and a second set 244 of switches, wherein the second set 242 of resistors and the second set 244 of switches are arranged in a ladder structure in which each switch 244 of the second set of switches is configured to bypass one of the resistors of the second set 242 of resistors in a closed state thereof. As optionally shown, the second set 242 of resistors comprises a plurality of resistors and the second set 244 of switches comprises a corresponding plurality of switches. Accordingly, as an optional feature, the circuit 240 may comprise some resistors without a corresponding switch. Furthermore, it is again to be noted, that a first and second set of elements (e.g. resistors or switches) may or may not comprise corresponding numbers of elements.

As explained before, the ladder structures of the feedback circuit 220 may allow reducing or even to minimize parasitic effects. In the ladder structure, for example, in a state where all switches are switched off, parasitic capacitances of the switches only have a limited influence on the RF amplifier circuit 200. As an example, in a ladder structure, the overall parasitic capacitance may be reduced by the number of series switches, e.g. in the form of transistors.

As another optional feature, the feedback circuit 220 comprises a first additional resistor, 236 which is serially coupled with the ladder structure of the resistive feedback circuit 230, and a second additional resistor 246, which is serially coupled with the ladder structure of the shunt feedback circuit 240. In addition, as an example, the feedback circuit 220 further comprises an optional decoupling capacitor 270 which is coupled between the output 114 of the amplifier 110 and each of the resistive feedback circuit 230 and the shunt feedback circuit 240. It is to be noted, that each of these elements is optional for the feedback circuit 220, such that embodiments may comprise none, only one, all, or any combination of these elements.

The first and second additional resistors 236, 264 may be configured to form or to provide a base impedance of the feedback circuit 220. The decoupling capacitor 250 may be configured to decouple direct current portions of an output signal of the amplifier 110 from the input 112 of the amplifier.

As another optional feature, the RF amplifier circuit 200 comprises a disable switch circuit, wherein the disable switch circuit comprises a first and a second disable switch 272, 274, wherein the first disable switch 272 is serially coupled with the resistive feedback circuit 230 and configured to disconnect the feedback circuit 220 from the input 112 of the amplifier 110. Furthermore, the second disable switch 274 is coupled between the output 114 of the amplifier 110 and each of resistive feedback circuit 230 and the shunt feedback circuit 240 and the second disable switch 274 is configured to disconnect the feedback circuit 220 from the output 114 of the amplifier 110.

As another optional feature, the RF amplifier circuit 200 comprises a control circuit 260. Control circuit 260 is configured to apply control signals ($a_1, a_2, \ldots, a_{n-1}, b_1, b_2, \ldots, b_{n-1}$) to the switches of the first and second set 234, 244 of switches to open and close the switches in order to change between different gain modes of the RF amplifier circuit.

As an example, control signals $a_i$, $b_i$, $i \in \{0, \ldots, n-1\}$ with n being, as an example, a corresponding number of resistors and switches of the respective first and second sets of resistors and switches, may be binary control signals, e.g. such that a signal $a_i=1$ or $b_i=1$ may correspond to a closed switch, such that the respective resistor is shunted. Vice versa a value of zero may be associated with a respective open switch.

As an example, any combination of switches may be closed or opened in order to adjust an impedance or resistance of the feedback circuit 220.

Furthermore, as an optional feature, the control circuit 260 may be configured to control the disable switch circuit to disconnect the feedback circuit 220 from the amplifier 110 in a gain mode having the highest gain. Hence, as shown in FIG. 2 the control circuit 260 may be configured to provide control signals $a_0$, $b_0$ to the first and a second disable switch 272, 274.

Optionally, the control circuit 260 is configured to apply a common control signal to switches of respective pairs of switches, each pair comprising one of the switches of the first set 234 of switches and one of the switches of the second set 244 of switches (e.g. a pair of switches being addressed by control signals $a_x$, $b_x$, such that $a_x=b_x$ with $x \in \{0, \ldots, n-1\}$). Hence, a signaling effort may be reduced, e.g. halved since two switches may share a common control signal.

Moreover, the control circuit 260 may be configured to control all switches of the first and second set 234, 244 of switches to be in an open state in a first gain mode, and to control the switches of a number of the pairs of switches to be in the closed state in a second gain mode having a reduced gain when compared to the first gain mode.

In a first gain mode, e.g. a high gain mode, e.g. the gain mode of RF amplifier circuit 200 with the second highest gain, all switches corresponding to control signals $a_y=b_y$ with $y \in \{1, \ldots, n-1\}$) may be in an open state. As an example, in the second highest gain mode the disable switches 272, 274 may be closed (e.g. via control signals $a_0$, $b_0$ of control circuit 260). As another example in a highest gain mode of the RF amplifier circuit, as explained before, the control circuit 260 may be configured to open switches 272 and 274 (e.g. $a_0=0$, $b_0=0$), such that the feedback circuit 220 is disconnected from the amplifier 110. As an example, a position of the switches of the first and second set 234, 244 of switches may be arbitrary for this highest gain mode. As an example, the switches of the first and second set 234, 244 of switches may be all in an open state for such a highest gain mode.

As an example, RF amplifier circuit may comprise at least N gain modes, wherein the control circuit 260 may be configured to provide, in a 0th gain mode, having the highest gain, of the RF amplifier circuit 200, a common control signal (e.g. $a_0=b_0=0$) to the first and second disable switch 272, 274 of the disable switch circuit, such that feedback circuit 220 is disconnected from the amplifier 110. As another optional feature and in addition, the control circuit 260 may be configured to provide, in an xth, $x \in \{1, \ldots, N-1\}$, gain mode, having a lower gain with increasing order x, control signals to the first and second disable switch and to the switches of the first and second set of switches, such that the first and second disable switch are closed (e.g. $a_0=b_0=1$), such that x−1 pairs of switches of the first and second set of switches are closed and such that the remaining switches of the first and second set of switches are open (e.g. for x=3 $a_1=b_1=1$ and $a_2=b_2=1$ and all other switches of the first and second set open).

The switch and hence impedance or resistance adaptation scheme according to embodiments may be performed with low toggling effort, since in between adjacent gain modes, only few switches may have to be toggled.

As another optional feature, RF amplifier circuit 200 comprises a switchable capacitor circuit 270 between an input 202 of the RF amplifier circuit 200 and the amplifier 110, wherein the switchable capacitor circuit 270 is configured to provide at least two different capacitances in two different gain modes.

The switchable capacitor circuit 270 may be configured to improve an input matching between an input 202 of the RF amplifier circuit 200 and the amplifier 110. As an example, the switchable capacitor circuit 270 may mitigate an impedance mismatch caused by a gain mode switch. Hence, the switchable capacitor circuit 270 may be configured to shift the input matching, for example, especially for low gain modes, in order to recenter the gain for a specific frequency.

As an example, the switchable capacitor circuit 270 may comprise a set of switchable capacitors which are coupled in parallel between the input 202 of the RF amplifier circuit and the input of the amplifier 112, wherein a respective switchable capacitor may comprise a switch and a resistor which are coupled serially. The switchable capacitor circuit 270 may further comprise a switch which is coupled between an input and an output of the switchable capacitor circuit and in parallel to the set of switchable capacitors. Alternatively the switchable capacitor circuit may comprise a capacitor which is coupled between the input and the output of the switchable capacitor circuit and in parallel to the set of switchable capacitors.

As another optional feature, the control circuit 260 may be configured to provide a control signal $c_0$ to the switchable capacitor circuit 270 in order to reduce an input capacitance of the amplifier 110 when the RF amplifier circuit is in a gain mode having a low gain. Optionally, the RF amplifier circuit may comprise a second control circuit, different from the control circuit 260, wherein the second control circuit is configured to control the switchable capacitor circuit 270.

As another optional feature, RF amplifier circuit 200 comprises a tank circuit 280, wherein the tank circuit is coupled between an output 204 of the RF amplifier circuit, a supply input 152 of the RF amplifier circuit 200 and the feedback circuit 220 and/or the output 114 of the amplifier. The tank circuit may, for example, be implemented as a passive tank load, e.g. comprising or being a LC resonator and/or a transformer (and/or comprising respective elements having a similar effect), or as an active tank load, e.g. comprising or being a gyrator or an active inductor (and/or comprising respective elements having a similar effect).

The tank circuit 280 may, for example, be configured to de-Q the tank circuit 280. Hence, the impedance of the tank circuit 280 and therefore the gain performance of the RF amplifier circuit 200 may be reduced.

As another optional feature, RF amplifier circuit 200 comprises an electrostatic discharge, ESD, protection circuit 290, which is coupled between an input 202 of the RF amplifier circuit 200 and a reference input 154. Optionally (not shown) RF amplifier circuit 200 may comprise alternatively or in addition an ESD protection circuit between an output 204 of the RF amplifier circuit and a reference input. ESD circuits may improve a robustness of the RF amplifier circuit 200.

As another optional feature, the RF amplifier circuit 200 further comprises a matching element 210 which is configured to match an input impedance of the matching element 210 to an input impedance of the amplifier 110. The matching element 210 may, for example, be an inductive off-chip matching element, which is coupled between an input 202 of the RF amplifier circuit 200 and each of the feedback circuit 220 and the input 112 of the amplifier.

Alternatively the matching element may be an inductive on-chip matching element which may be coupled between the input 112 of the RF amplifier circuit 200 and each of the feedback circuit 220 and the input 112 of the amplifier, and/or between the input 112 of the amplifier and each of the feedback circuit 220 and the input 202 of the RF amplifier circuit.

Figure 3:
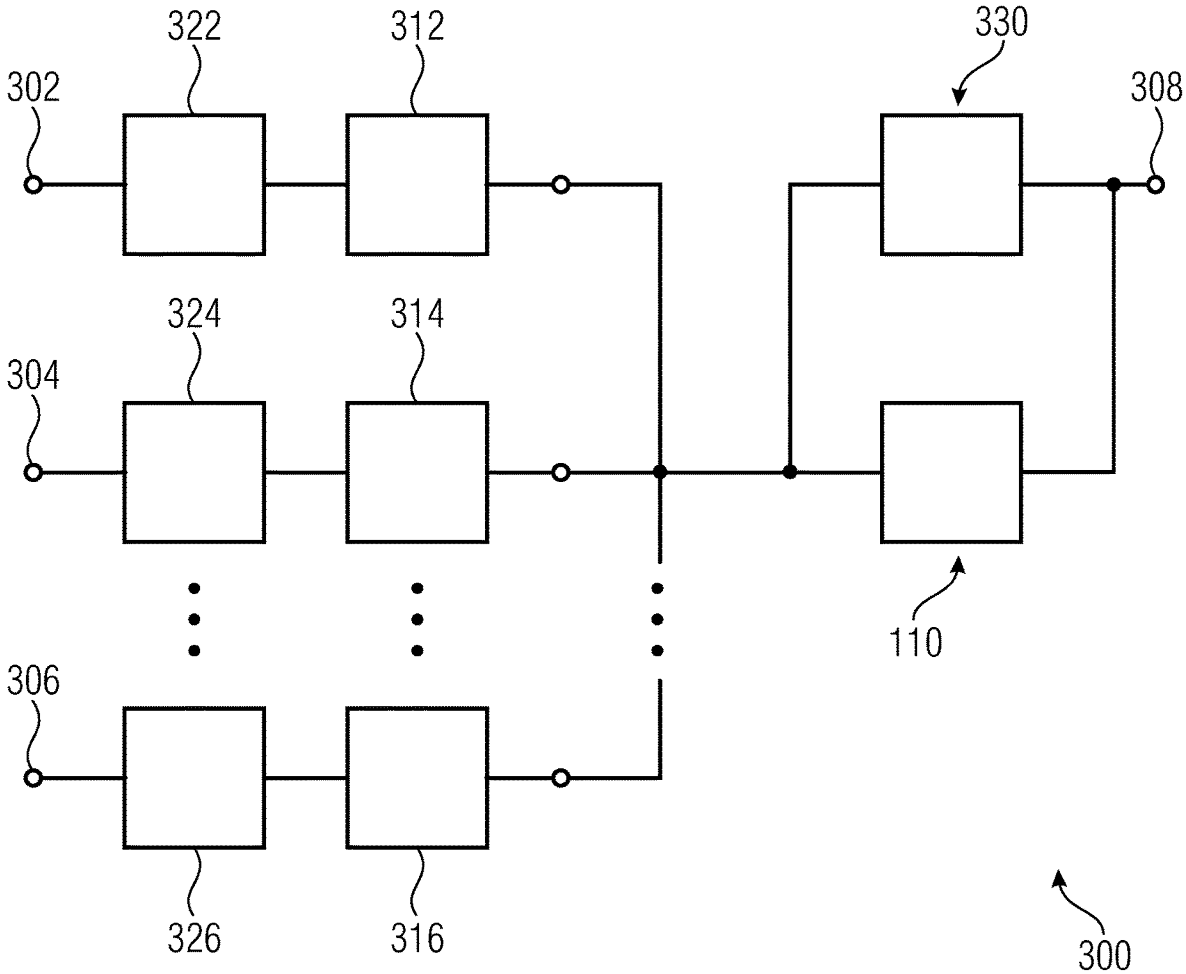
FIG. 3 shows a schematic view of an RF amplifier circuit with a plurality of inputs and a plurality of matching elements, according to embodiments of the disclosure.

FIG. 3 shows a schematic view of an RF amplifier circuit with a plurality of inputs and a plurality of matching elements, according to embodiments of the disclosure. FIG. 3 shows RF amplifier circuit 300 comprising an amplifier 110, a feedback circuit 330 and an output 308. RF amplifier circuit 300 and feedback circuit 330 may especially comprise any of the features as explained in the context of FIGS. 1 and 2, individually or taken in combination.

Furthermore, the RF amplifier circuit 300 comprises a plurality of inputs 302, 304, 306 and a plurality of matching elements 312, 314, 316, wherein a matching element of the plurality of matching elements is coupled between a respective input of the RF amplifier circuit and the input of the amplifier and wherein respective inputs of the plurality of inputs are configured to be provided with respective RF signals comprising different frequencies or different frequency bands. Furthermore, a respective matching element is configured to match an input impedance of the respective matching element to an input impedance of the amplifier for a respective RF signal.

As another optional feature, RF amplifier circuit 300 comprises a plurality of bandpass filters 322, 324, 326, wherein a respective bandpass filter is coupled between a respective input of the RF amplifier circuit and a respective matching element. Furthermore, a respective bandpass filter is configured to pass a specific frequency range of an RF signal provided to a respective input of the RF amplifier circuit. Hence, embodiments may allow addressing a plurality of frequency bands.

Figure 4:
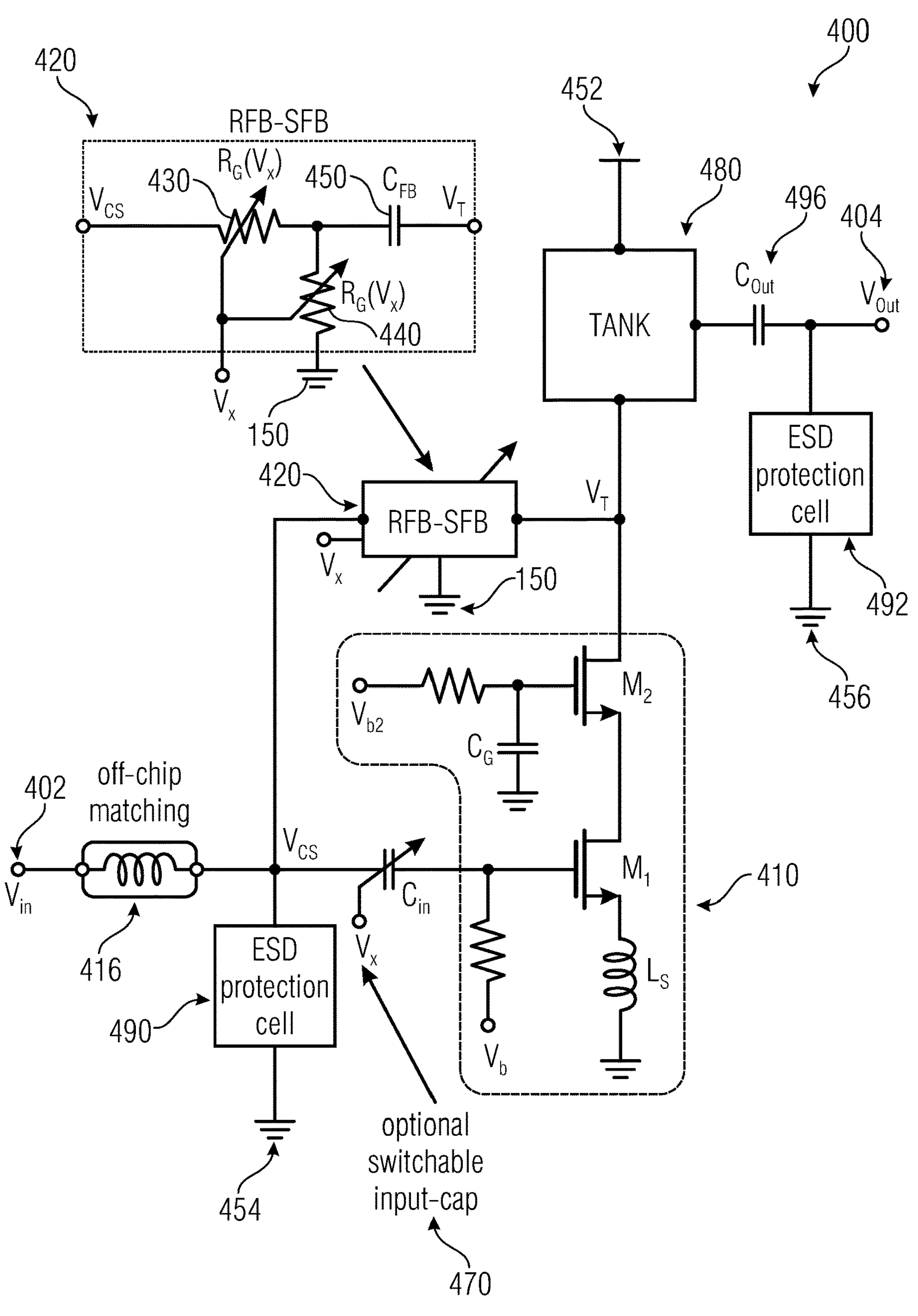
FIG. 4 shows a schematic view of an RF amplifier circuit according to further embodiments of the disclosure.

FIG. 4 shows a schematic view of an RF amplifier circuit according to further embodiments of the disclosure. FIG. 4 shows RF amplifier circuit 400 comprising an amplifier 410 and a feedback circuit 420. FIG. 4 may show a simplified feedback circuit or circuitry 420 (e.g. RFB-SFB) with RFFE single cascode LNA.

As an optional feature, amplifier 410 comprises a cascode, wherein the cascode comprises a common-source stage (transistor M1) and a common-gate stage (transistor M2), wherein the drain of the common-source stage is coupled with the source of the common gate stage, and wherein the feedback circuit 420 is coupled with the gate of the common-source stage and with the drain of the common-gate stage. Transistor M1 comprises, as an optional feature, a source degeneration (inductivity $L_s$).

As another optional feature, RF amplifier circuit 400 comprises a switchable capacitor circuit 470 between an input of the RF amplifier circuit and the amplifier in the form of switchable Input-Capacitor).

As further optional features, RF amplifier circuit 400 comprises a tank circuit 480, coupled between an output 404 (Vout) of the RF amplifier circuit, a supply input 452 of the RF amplifier circuit and the feedback circuit 420 and the output of the amplifier 410; ESD protections circuits 490, 492, coupled between an input of the RF amplifier circuit and a reference input 454 and between an output 404 of the RF amplifier circuit and a reference input 456 and an inductive off-chip matching element 416 which is coupled between an input 402 of the RF amplifier circuit 400 and each of the feedback circuit 420 and the input of the amplifier 410.

As another optional feature, RF amplifier circuit 400 comprises an output capacitor) 496. The output capacitor may be configured to decouple direct-current signal components from the output 404 of the RF amplifier circuit 400.

In addition, FIG. 4 shows the feedback circuit 420 in more detail. As an optional feature, the resistive feedback circuit 430 and the shunt feedback circuit 440 are same variable resistors. It is to be noted that according to some embodiments the resistive feedback circuit 430 and the shunt feedback circuit 440 may comprise a same ladder structure with a same number of resistors and switches. Optionally, even the respective resistance values of a resistor of the first set of resistors may correspond, e.g. be identical, to a resistance value of a resistor of the second set of resistors. This may allow a particular simple control scheme and may reduce manufacturing costs. However, different setups with varying or differing numbers of resistors and switches in the resistive feedback circuit 430 and the shunt feedback circuit 440, e.g. with differing resistance values (resistors of first set vs. resistors of second set) may be used according to embodiments as well. As another optional feature, feedback circuit 420 comprises a decoupling capacitor 450, which is coupled between the output of the amplifier and each of the resistive feedback circuit 430 and the shunt feedback circuit 440.

Furthermore, it is to be noted that elements of FIG. 4 corresponding to elements as explained before, e.g. matching element 416 to matching element 210 from FIG. 2 or tank circuit 480 to tank circuit 280 may comprise any of the features as explained before.

Furthermore, an optional control circuit is not shown in FIG. 4. However, inputs $V_x$ may provide control inputs, for example in order to adjust an impedance value of the feedback circuit 420 and for example, a capacitance of the switchable capacitor circuit 490. However, it is to be noted that $V_x$ may represent a plurality of control signals, e.g. individual signals for each of the switches of a first set of switches of the resistive feedback circuit 430 and/or for each of the switches of a second set of switches of the shunt feedback circuit 440. Optionally, $V_x$ may represent, alternatively or in addition, a plurality of common control signals for pairs of switches, each pair comprising one of the switches of the first set of switches and one of the switches of the second set of switches.

In general, embodiments according to the disclosure comprise or propose a novel gain-step concept, which may enable the advantages of variable gain functionality with intermediate-attenuation approaches, e.g. good NF and linearity performance and good or even best RF-performance possible with reduced or minimized chip-area and power consumption by the usage of a, e.g. unique, combination of LNA core circuits which are switchable (see e.g. FIG. 4).

One of the or even the main component may be the feedback circuit 420, referred to herein as well as resistive feedback with resistive shunt feedback (RFB-SFB) on the drain node of the last transistor (e.g. M2) at the input stage (It is to be noted that embodiments may comprise different input stages such a e.g. simple common-source, single cascode or even dual cascode. Hence, such configurations are possible as well). Both resistor values (e.g. $R_x$) may be variable and controlled by $V_x$. This circuit may enable accurate gain reduction with good linearity improvement and low NF degradation.

Optional, dependent on the required gain reduction due to the change in input stage impedance, it may, for example, be advantageous or even necessary (e.g. in many cases) to shift the input matching slightly to re-center the gain to the wanted frequency (may, for example, be important for gain modes with 12 dB $S_{21}$ or even lower). Therefore, the switchable input DC-decoupling capacitor 470 may optionally be implemented, e.g. as explained before, to slightly enhance or to enhance the input impedance.

Figure 5:
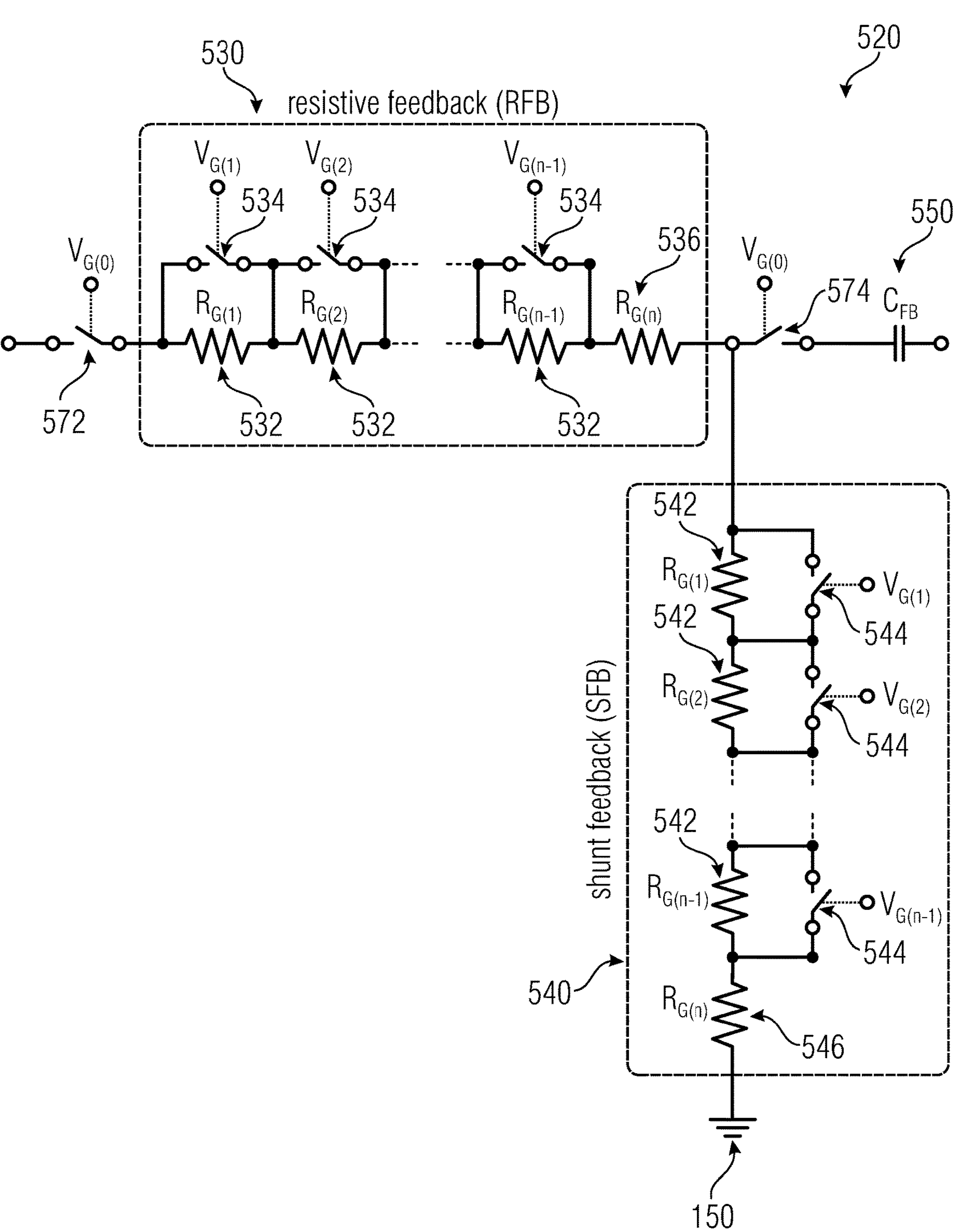
FIG. 5 shows a schematic view of a feedback circuit according to embodiments of the disclosure.

FIG. 5 shows a schematic view of a feedback circuit according to embodiments of the disclosure. FIG. 5 may show a feedback circuitry (RFB-SFB) for a RFFE single cascode LNA. Feedback circuit 520 comprises a resistive feedback circuit 530 (Resistive Feedback (RFB)), wherein the resistive feedback circuit 530 comprises a first set 532 of serially coupled resistors ($R_{G(1)}, \ldots, R_{G(n-1)}$) and a first set 534 of switches, wherein the first set of resistors and the first set of switches are arranged in a ladder structure in which each switch of the first set of switches is configured to bypass one of the resistors of the first set of resistors in a closed state thereof.

Feedback circuit 520 further comprises a shunt feedback circuit 540 (Shunt Feedback (SFB)), wherein the shunt feedback circuit comprises a second set 542 of serially coupled resistors ($R_{G(1)}, \ldots, R_{G(n-1)}$) and a second set 544 of switches, wherein the second set of resistors and the second set of switches are arranged in a ladder structure in which each switch of the second set of switches is configured to bypass one of the resistors of the second set of resistors in a closed state thereof.

As further optional features, feedback circuit 520 comprises a first additional resistor 536 which is serially coupled with the ladder structure of the resistive feedback circuit 530 and a second additional resistor 546 which is serially coupled with the ladder structure of the shunt feedback circuit and a decoupling capacitor 550 which is configured to be coupled between the output of the amplifier and each of the resistive feedback circuit 530 and the shunt feedback circuit 540.

Optionally, feedback circuit 520 further comprises a disable switch circuit comprising a first and a second disable switch 572, 574, wherein the first disable switch 572 is serially coupled with the resistive feedback circuit 530 and wherein the second disable switch 574 is configured to be coupled between the output of the amplifier and each of resistive feedback circuit 530 and the shunt feedback circuit 540.

The above discussed elements may comprise any or all of the functionality, details and features that were explained in the context of FIGS. 1 to 4, individually or taken in combination.

As explained before, optionally, as shown, the resistive feedback circuit 430 and the shunt feedback circuit 440 (referring to FIG. 4) may comprise a same ladder structure with a same number of resistors and switches and the respective resistance values of a resistor of the first set of resistors may correspond, e.g. may be identical, to a resistance value of a resistor of the second set of resistors.

As shown in FIG. 5, switches of the resistive feedback circuit 430 and the shunt feedback circuit 440 may be controlled with control signals $V_{G(0)}, \ldots, V_{G(n-1)}$. These may be provided by an optional control circuit (e.g. as shown in FIG. 2, for example with $a_0$, $b_0$ corresponding to $V_{G(0)}$, $a_1$, $b_1$ corresponding to $V_{(1)}, \ldots$; e.g. with $V_{G(0)}, \ldots, V_{G(n-1)}$ being elements of a control signal vector $V_x$ as shown in FIG. 4).

In other words, the first set 532 of resistors and the second set 542 of resistors may comprise pairs of corresponding resistors, wherein a first resistor of a pair of corresponding resistors is a resistor of the first set 532 of resistors, wherein a second resistor of a pair of corresponding resistors is a resistor of the second 542 set of resistors, and wherein corresponding resistors have a same resistance value. Furthermore, the first set 534 of switches and the second set 544 of switches may comprise pairs of corresponding switches, wherein corresponding switches are configured to bypass respective resistors of a pair of corresponding resistors and the RF amplifier circuit may comprise a control circuit which is configured to provide switches of a pair of corresponding switches with a common control signal (e.g. $V_{G(z)}$, $z \in \{1, n-1\}$) in order to equally open or to equally close the switches of the pair of corresponding switches.

In the following, an example for the functionality of the circuit according to FIG. 5 is disclosed. FIG. 5 shows the feedback circuit 520 in the form of a switchable RFB-SFB circuitry. In this example, 5 gain modes are shown, which could be extended or reduced depending on the specific gain-step problem statement (visible with dashed lines). Table 1 shows an example for which switches may be enabled (corresponding resistor gets shorted) or disabled for gain mode $G_0$ to $G_4$. For $G_0$ also called HG mode the RFB-SFB may be switched-off ($V_{G(0)}=0$). In the next mode $G_1$ the RFB-SFB may get enabled ($V_{G(0)}=1$) but all other switches may be disabled. In this mode the feedback system may have the largest resistance ($R=R_{G(1)}+R_{G(2)}+R_{G(n-1)}+R_{G(n)}$). As an example, in every gain mode the overall resistance may be reduced by shunting resistances, which may result in a reduced power gain performance of the LNA. In the lowest gain mode, only $R_G(n)+R_{ON}$ (with $R_{ON}$ e.g. being a resistance of the switches in an ON-state) of the switches may be in effect or visible.

TABLE 1

Biasing Table (example)

| | $V_{G(0)}$ | $V_{G(1)}$ | $V_{G(2)}$ | $V_{G(n-1)}$ |
|---|---|---|---|---|
| $G_0$ | 0 | 0 | 0 | 0 |
| $G_1$ | 1 | 0 | 0 | 0 |
| $G_2$ | 1 | 1 | 0 | 0 |
| $G_3$ | 1 | 1 | 1 | 0 |
| $G_4$ | 1 | 1 | 1 | 1 |

Figure 6:
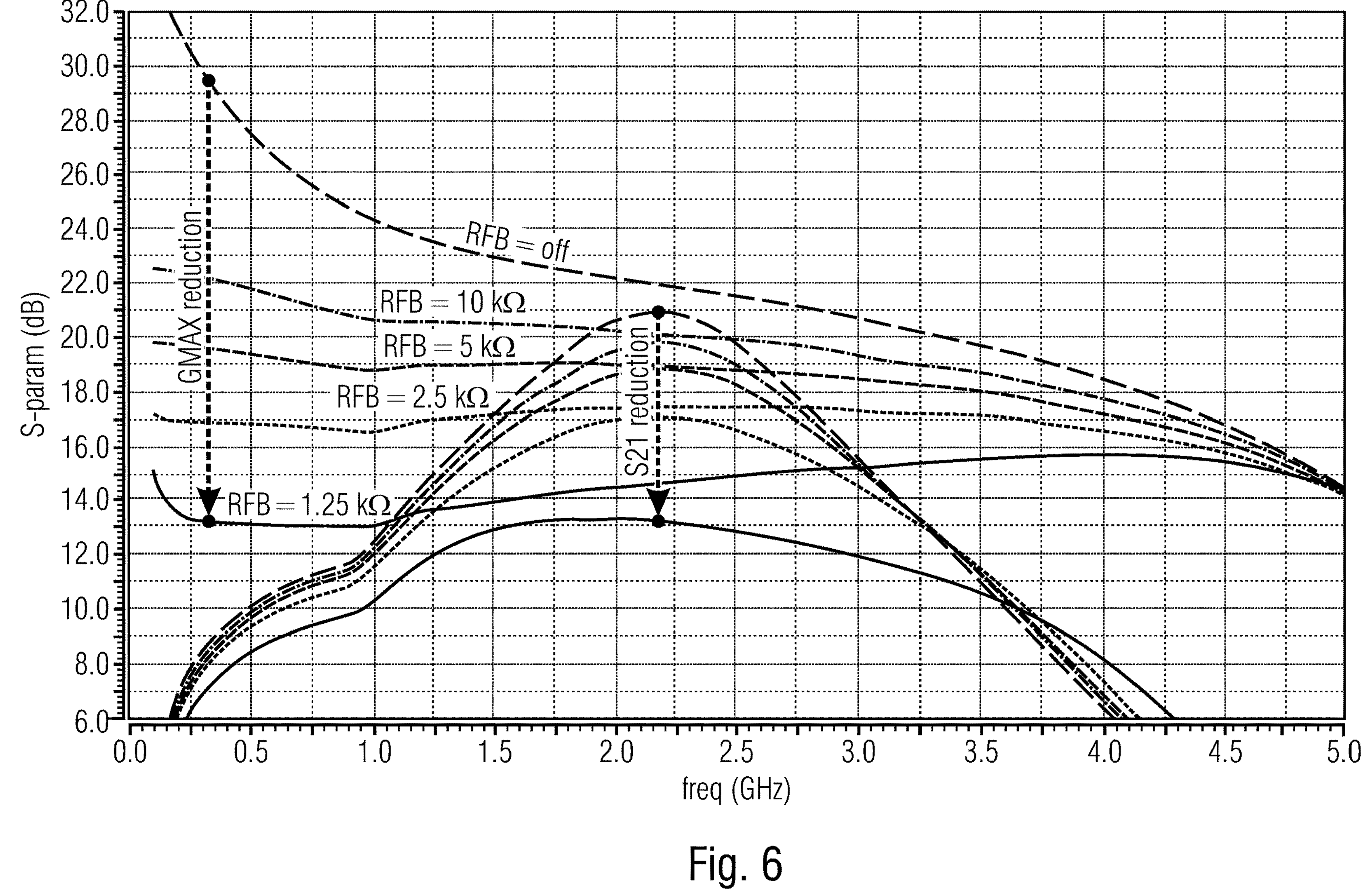
FIG. 6 shows an example of S-parameters over frequency for Gmax and $S_{21}$ simulations with different resistive feedback circuit resistors according to embodiments of the disclosure.
Figure 7:
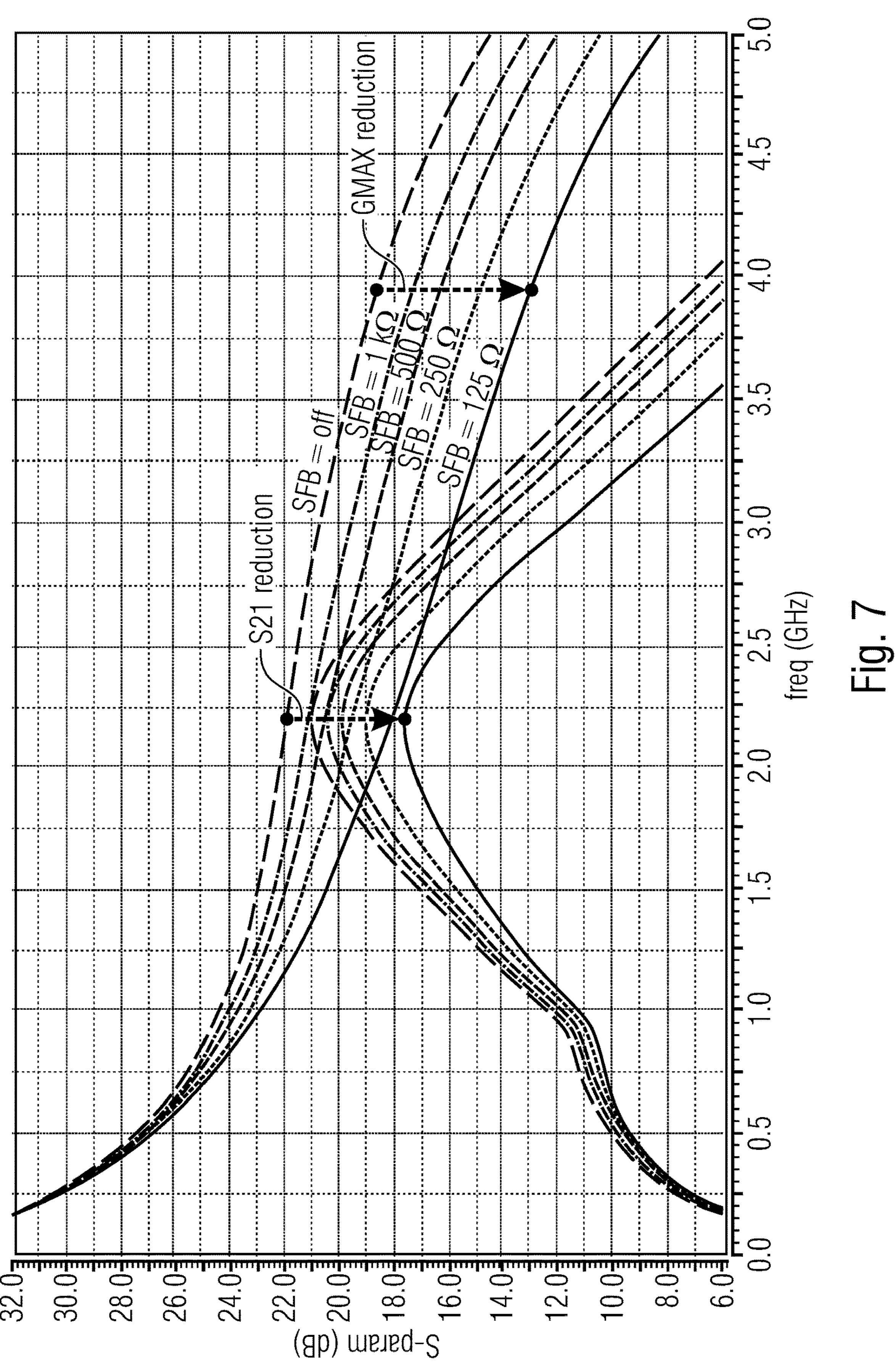
FIG. 7 shows an example of S-parameters over frequency for Gmax and $S_{21}$ simulations with different shunt feedback circuit resistors according to embodiments of the disclosure.

FIGS. 6 and 7 show examples for simulations of S-parameters over frequency according to embodiments of the disclosure.

FIG. 6 shows an example of S-parameters over frequency for Gmax and $S_{21}$ simulations with different resistive feedback circuit, e.g. resistive feedback (RFB), resistors according to embodiments of the disclosure. $S_{ab}$ may be a respective scattering parameter or S-parameter of a circuitry according to an embodiment. FIG. 7 shows an example of S-parameters over frequency for Gmax and $S_{21}$ simulations with different shunt feedback circuit, e.g. shunt feedback (SFB), resistors according to embodiments of the disclosure.

As shown in FIG. 6, enabling the resistive feedback circuit, e.g. RFB, and lowering the value of the resistor a high-pass behavior may be enabled with reduced gain performance. In contrast, FIG. 11 enables the shunt feedback circuit, e.g. SFB which has a low-pass behavior. Combining both feedback structures as shown in FIG. 5, it may be possible to enable a band-pass or a broadband flat Gmax in the wanted frequency bands with ultra-low gain variation (as will be shown in more detail in the following, e.g. in the context of FIG. 12). In addition, both structures may improve the linearity performance (resistive feedback circuit e.g. RFB may allow reducing voltage gain of input stage, shunt feedback circuit, e.g. SFB, may allow reducing the output impedance), which may enable excellent linearity in every gain mode by low NF degradation.

According to embodiments of the disclosure, parasitic effects may be minimized. To minimize parasitic effects of the switchable feedback system 520, embodiments comprise the ladder structure e.g. instead of a parallel circuit structure. In a parallel circuitry, switched-off transistors may cause a high overall capacitance and may highly degrade the RF performance, e.g. in all gain-modes. In a ladder structure, the overall parasitic may get reduced by the numbers of series transistors which may help to minimize parasitic effects (As an example, $C_{OFFX}$ may be the capacitance of the switch corresponding to resistor $R_{G(X)}$ (referring to FIG. 5) in an OFF-state, e.g. a parasitic impedance, such that the overall capacitance of a ladder structure may be: $C_{OFF}=1/(1/C_{OFF1}+1/C_{OFF2}+\ldots+1/COFF_{n-1})$.

Figure 8:
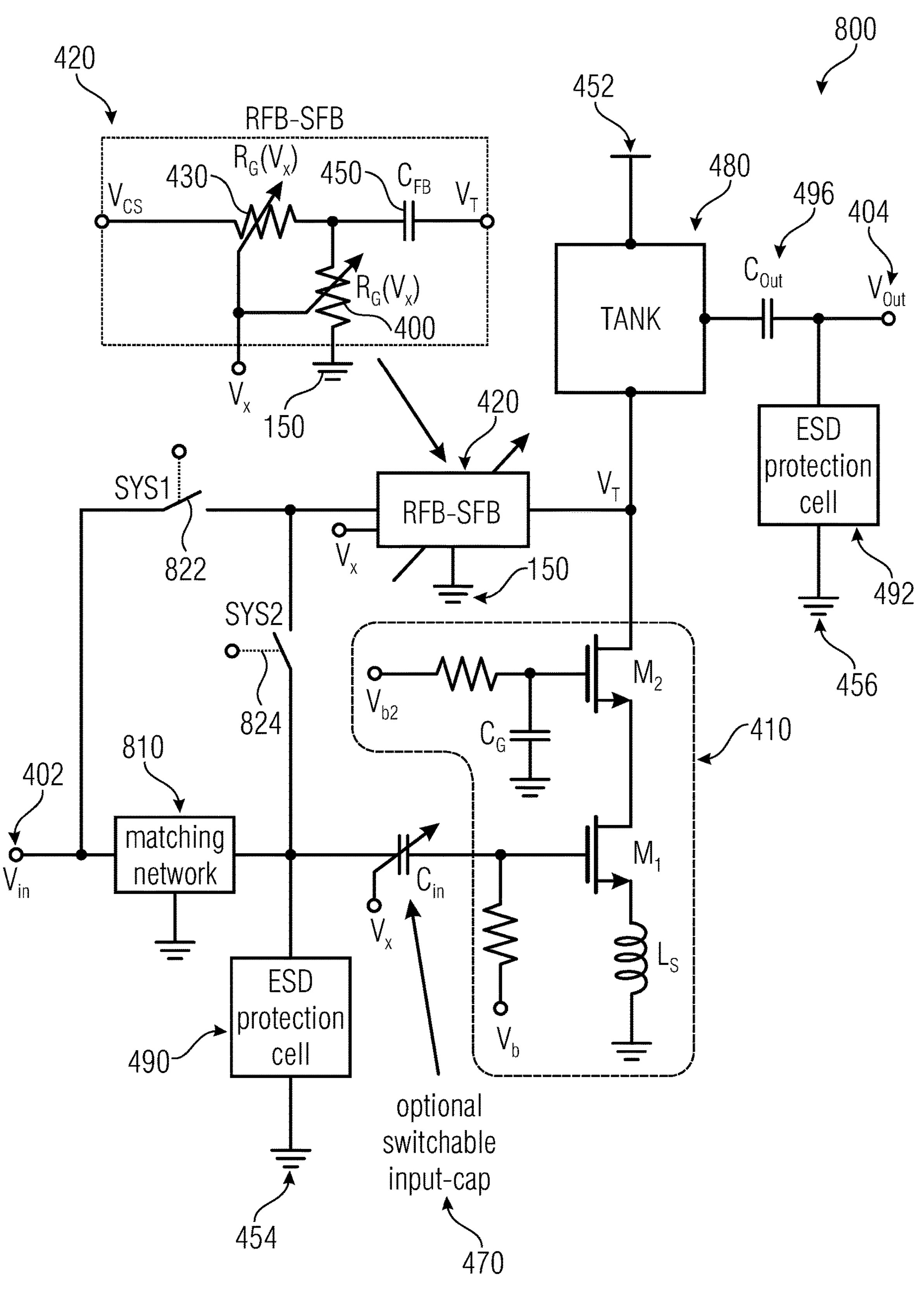
FIG. 8 shows a schematic view of an RF amplifier circuit with an optional on-chip matching element according to embodiments of the disclosure.

FIG. 8 shows a schematic view of an RF amplifier circuit with an optional on-chip matching element according to embodiments of the disclosure. FIG. 8 may show a simplified feedback circuitry (e.g. RFB-SFB) with RFFE single cascode LNA with on-chip matching network. Apart from the elements explained before, e.g. in particular in the context of FIGS. 1 to 5, RF amplifier circuit 800 comprises an inductive on-chip matching element 810 (e.g. a Matching Network).

Depending on the state of the switches 822, 824 the inductive on-chip matching element 810 may be coupled between the input 402 of the RF amplifier circuit 800 and each of the feedback circuit 420 and the input of the amplifier 410, or the inductive on-chip matching element 810 may be coupled between the input of the amplifier 410 and each of the feedback circuit 420 and the input 402 of the RF amplifier circuit 400.

It is to be noted, that embodiments according to the disclosure may comprise switches 822 and 824, such that a coupling of the on-chip matching element may be adapted. However, the switches 822, 824 are only optional and hence embodiments may comprise one coupling of the matching element or the other.

Figure 14:
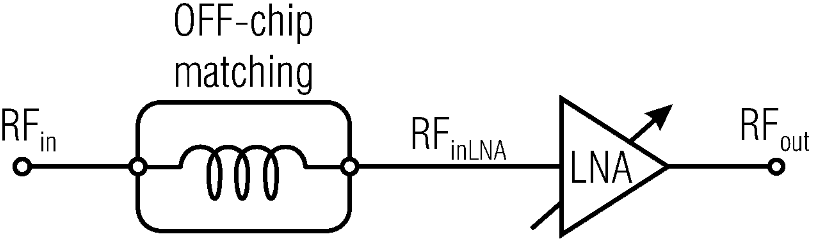
FIG. 14 shows an example for an RFFE LNA with external matching inductor.

To sum up, embodiments according to the disclosure may comprise on-chip matching LNAs. In contrast, FIG. 14 shows an example of an RFFE LNA with an external matching inductor. FIG. 14 shows an input $RF_{in}$, for an RF signal and an inductive matching element in the form of an OFF-chip matching component, which is coupled with the input $RF_{in}$ and with an input $RF_{inLNA}$ of an amplifier. The amplifier is a low-noise amplifier, LNA, wherein the LNA is coupled with a signal output $RF_{out}$.

Figure 15:
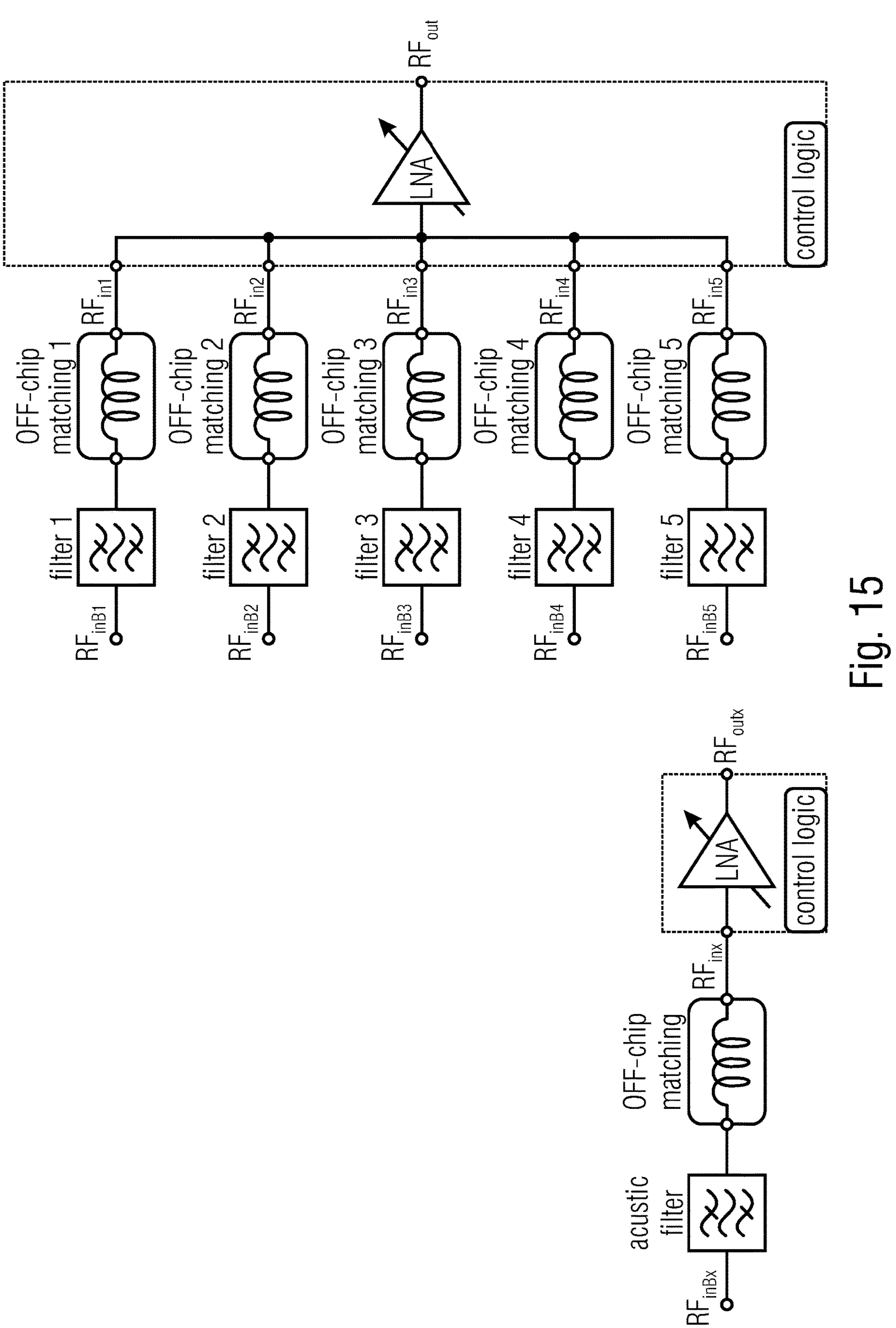
FIG. 15 shows an example for a single LNA block (left) and for a LNA block on a complex monolithic RFFE module (right).

Modern RFFE mobile communication modules have a high complexity because of a high amount of different frequency bands as shown in FIG. 15. FIG. 15 shows an example for a single LNA block (left) and for a LNA block on a complex monolithic RFFE module (right). The single LNA block (left) comprises an input $RF_{inBx}$, coupled with an acoustic filter. Between the acoustic filter and a controllable LNA comprising a control logic, an inductive matching element in the form of an OFF-chip matching component is arranged, which is coupled with the filter and an input $RF_{inx}$ of the LNA. The output of the LNA is coupled with an output $RF_{outx}$. The complex monolithic RFFE module (right) comprises a controllable LNA with a plurality of inputs, all coupled with respective filters, matching elements and inputs (e.g., such that $x \in \{1, 2, 3, 4, 5\}$).

As mentioned before, many, or even most, conventional RFFE LNAs, as shown in FIGS. 14 and 15, may use OFF-chip matching networks to achieve best NF performance. Especially in the low frequency operating area, it may be advantageous or even necessary because large high-Q inductance values may be difficult to realize ON-chip. Depending on the technology and the available ON-chip metal stack-up, it may be advantageous to implement the input matching ON-chip to achieve the same or improved NF compared to OFF-chip (e.g. with reduced input parasitic available). In this case the resistive feedback system can be connected before (called SYS1) the "matching network" or after the matching network (called SYS2) (referring to FIG. 8). Depending on the requirements and the LNA system, both options may comprise distinct or different advantages.

Figure 9:
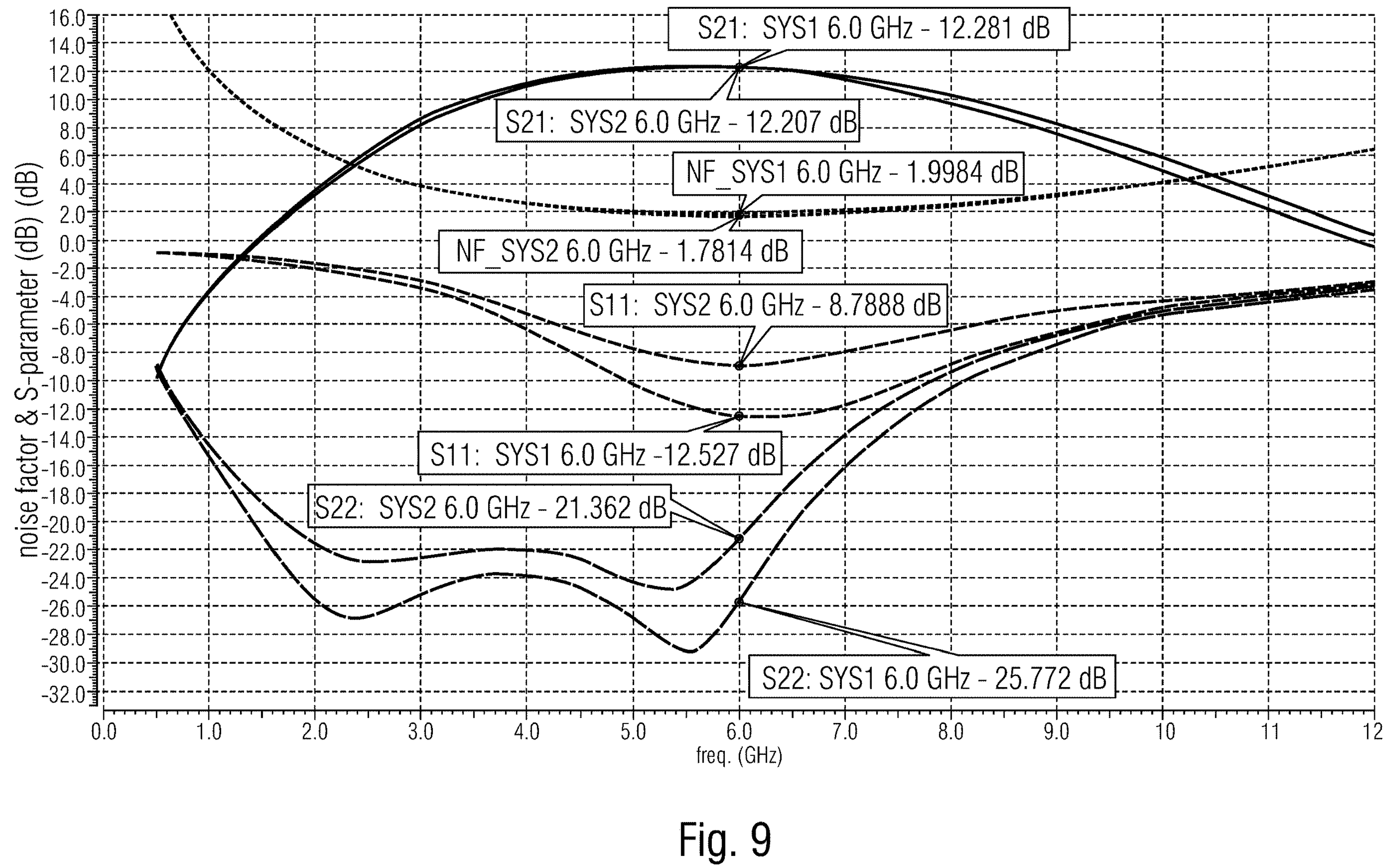
FIG. 9 shows an example for simulations of S-parameters over frequency according to embodiments of the disclosure.

FIG. 9 shows an example for simulations of S-parameters over frequency according to embodiments of the disclosure. FIG. 9 shows simulation results of a 5 to 7 GHz LNA for SYS1 and SYS2 (Referring to FIG. 8). FIG. 9 shows an example for the RF-performance of both Systems (SYS1 and SYS2) with the same $S_{21}$ of 12 dB (6 GHz LNA). Connecting the resistive feedback system 430 before the on-chip matching network 810 (SYS2) may lead to less degradation in NF performance (NF=1.8 dB) (matching may act as RF block) but with the disadvantage in matching ($S_{11}$=−8.8 dB, S22=−21.362) and about 1 dB worse IIP3 (e.g. Input Intercept Point). Connecting the resistive feedback 430 after the on-chip matching 810 (SYS1) and changing the resistances of the RFB-SFB 420 to reach again 12 dB $S_{21}$, may enable excellent matching ($S_1$=−12.5 dB, $S_{22}$=−25.8 dB), but may degrade the NF to 2.0 dB. Hence, embodiments may allow fulfilling differing requirements according to a specific application.

In general, embodiments may be implemented in bulk CMOS technologies and/or in SOI technologies (CMOS). The implementation in bipolar technologies is also possible.

Figure 10:
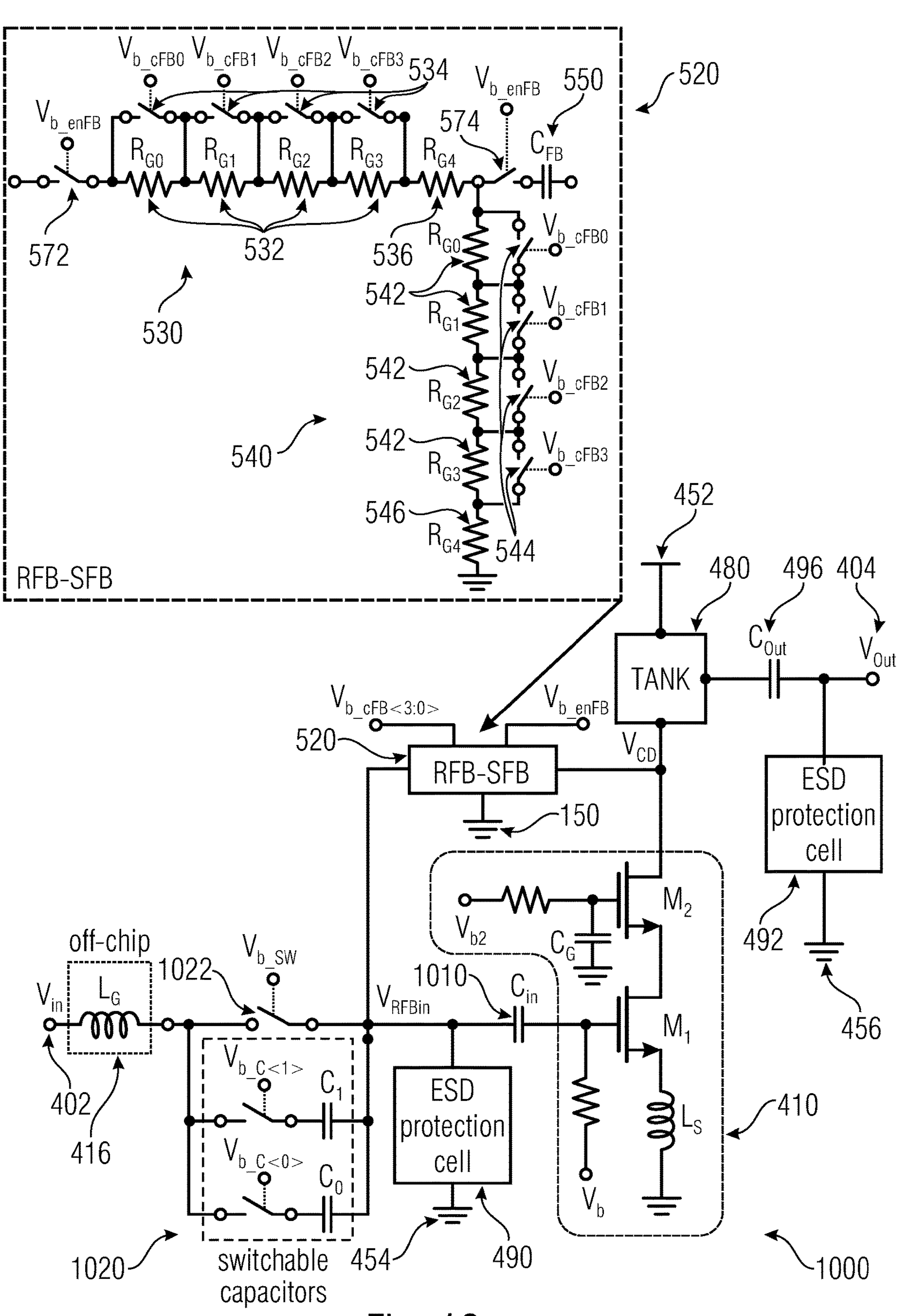
FIG. 10 shows a schematic view of an RF amplifier circuit with an optional switchable capacitor circuit according to embodiments of the disclosure.

FIG. 10 shows a schematic view of an RF amplifier circuit with an optional switchable capacitor circuit according to embodiments of the disclosure. FIG. 10 shows an example for the technical implementation of an embodiment. FIG. 10 shows RF amplifier circuit 1000 comprising, apart from the elements as explained before, an optional input capacitor 1010 ($C_{in}$) and a switchable capacitor circuit 1020. As explained before, the switchable capacitor circuit 1020 may be configured to provide at least two different capacitances in two different gain modes.

As optionally shown, the switchable capacitor circuit 1020 may comprise a set of switchable capacitors which are coupled in parallel between the input 402 of the RF amplifier circuit 400 and the input of the amplifier, wherein a respective switchable capacitor comprises a switch and a resistor which are coupled serially and wherein the switchable capacitor circuit 1020 comprises a switch 1022 which is coupled between the input and the output of the switchable capacitor circuit and in parallel to the set of switchable capacitors FIG. 10 shows an example for the introduction of the resistive and shunt feedback (RFB-SFB) 520 in combination with switchable input capacitors (in circuit 1020) (e.g. improving input matching for low gain modes, for example for the 6 dB and 9 dB gain modes). To shunt the input capacitors a RF-transistor (e.g. for switch 1022) with large width may be used. To enable good or even excellent sensitivity-on-demand, the resistance of the feedback 530 and shunt feedback 540 may get reduced in every gain-step. This may enable improved linearity but may degrade the NF performance (However, there may, for example, be relaxed requirements with lower power gain).

In general, switches (e.g. RFB-SFB RF-switches) may be designed or implemented as follows or may in other words comprise the following characteristics according to embodiments of the disclosure:

$R_{ON}$ (e.g. a resistance of a switch in an ON-state): A low $R_{ON}$ has an advantage but is not mandatory. Higher $R_{on}$ may lead to a lower value of used poly resistors and therefore a larger poly resistor size may be necessary, which may increase the substrate parasitics.

$C_{OFF}$ (e.g. a parasitic capacitance of a switch in an OFF-state): $C_{OFF}$ may be designed or implemented as a low value, e.g. as low as possible, to minimize parasitic capacitances which may degrade the RF performance. The width of the transistors may, for example, be large enough to achieve the wanted linearity requirements (may, for example, be highly important for the low-gain gain modes, e.g. the gain mode of 6 dB where all RF-switches may be enabled).

The design of the switchable capacitors (e.g. referring to the switchable capacitors of switchable capacitor circuit 1020 of FIG. 10) or switchable input capacitors may be implemented as series switch+capacitor. Regarding this, embodiments may comprise the following characteristics:

$C_{OFF}$ (e.g. a capacitance of a switchable capacitor in an OFF state, e.g. a capacitance of a switch of a switchable capacitor, comprising the switch and a capacitor, in an OFF state): $C_{OFF}$ may be less critical and may have only a minor or even no impact in RF-performance.

$R_{ON}$ (e.g. a resistance of a switchable capacitor in an ON-state): $R_{ON}$ may, for example, be low, or even as low as possible to maximize the quality factor of the capacitor for good RF-performance. Therefore, large width transistors may be used.

Comment: In this design, the switchable capacitors may be implemented in front of $V_{RFBin}$ (e.g. referring to FIG. 10). As described in the context of FIG. 4, another solution according to embodiments (e.g. with less chip or chip space consumption) may be to switch the capacitor $C_{in}$ (see e.g. FIG. 14).

Figure 11:
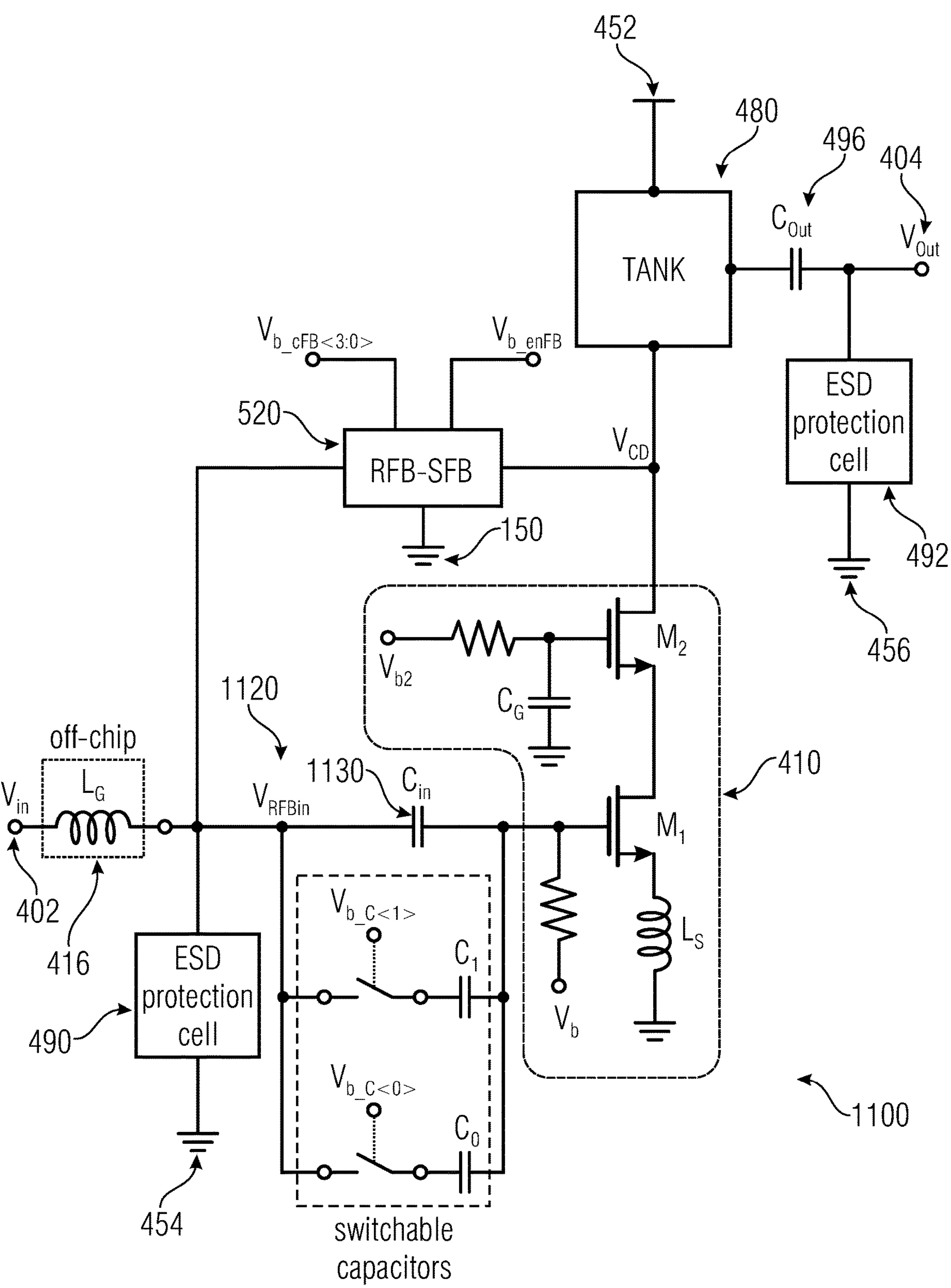
FIG. 11 shows a schematic view of an RF amplifier arrangement with a switchable capacitor circuit between feedback circuit and amplifier, according to embodiments of the disclosure.

FIG. 11 shows a schematic view of an RF amplifier arrangement with a switchable capacitor circuit between feedback circuit and amplifier, according to embodiments of the disclosure. FIG. 11 may show a technical implementation of an embodiment with a switchable input capacitor at $C_{in}$. FIG. 11 shows RF amplifier circuit 1100 comprising, apart from the elements as explained before, a switchable capacitor circuit 1120, wherein the switchable capacitor circuit 1120 comprises a set of switchable capacitors which are coupled in parallel between the input 402 of the RF amplifier circuit 400 and the input of the amplifier, wherein a respective switchable capacitor comprises a switch and a resistor which are coupled serially and wherein the switchable capacitor circuit 1120 comprises a capacitor 1130 which is coupled between the input and the output of the switchable capacitor circuit and in parallel to the set of switchable capacitors.

In this case, or in other words according to this embodiments, only additional RF-switches may, for example, be needed but not additional capacitors and no additional shunt switch 1022 as in FIG. 10. For low gain modes, e.g. (referring to Table 1) gain modes $G_5$ and $G_6$, $C_{in}$ may be reduced (e.g. switch-off $C_0$ and/or $C_1$) to increase the input impedance and to shift the input matching to the wanted frequency. If a low capacitance, e.g. of at least 200 fF and at most 800 fF is necessary as $C_{in}$ for the lowest gain mode (e.g. G), according to embodiments, it may also be possible to generate this capacitance with the switched-off RF-switches ($C_{OFF}$) of $C_1$ and $C_0$ and $C_{in}$ may be neglected. Furthermore, it is to be noted that embodiments comprising a switchable capacitor circuit as explained in the context of FIG. 11 may, for example, be implemented with little simulation effort, in order to determine appropriate parameter values for the circuit.

However, embodiments comprising a switchable capacitor circuit as explained in the context of FIG. 10 may, for example, require little chip space.

Figure 12:
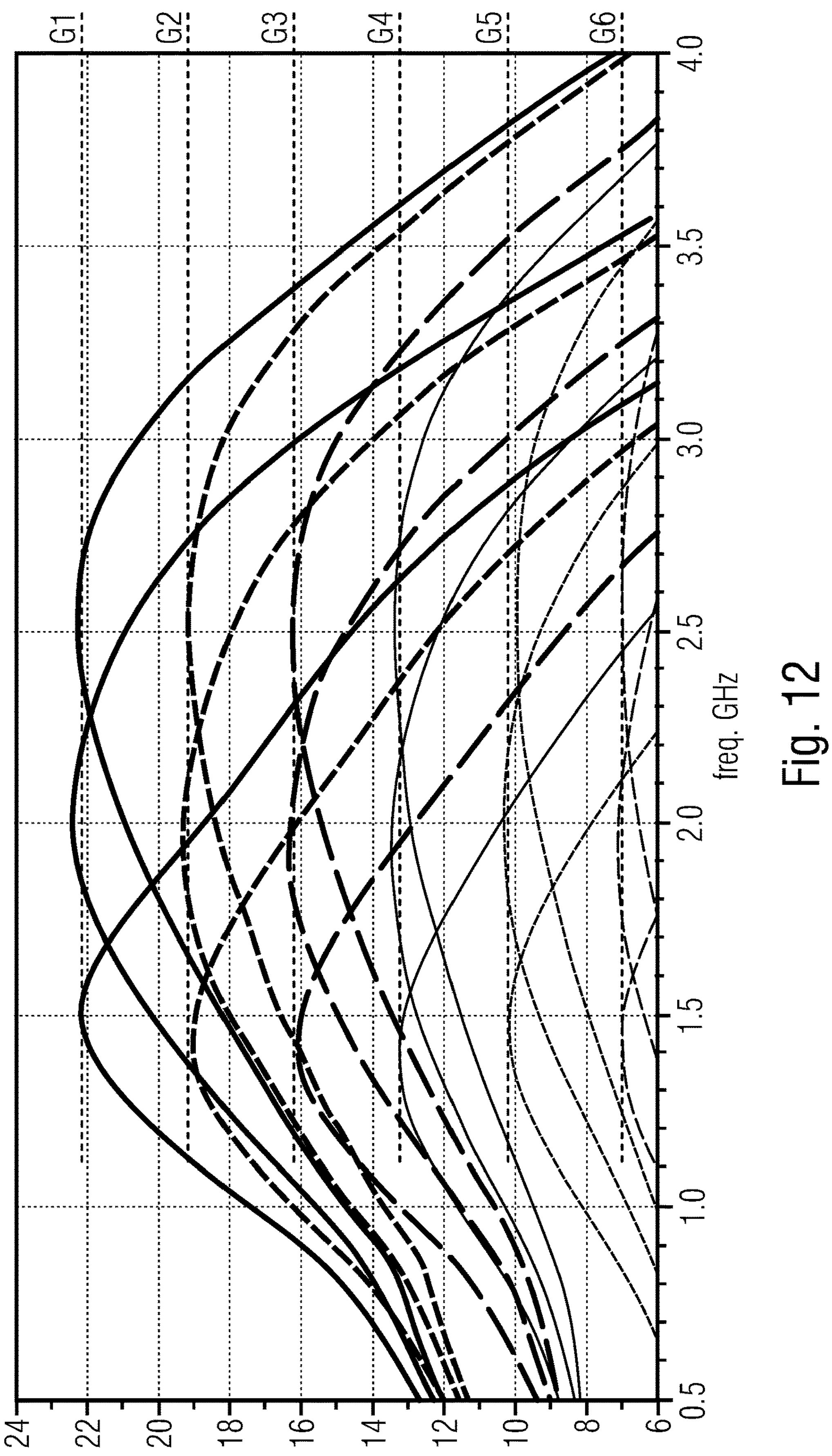
FIG. 12 shows an example for a simulation of S-parameters over frequency according to embodiments of the disclosure.

FIG. 12 shows an example for a simulation of S-parameters over frequency according to embodiments of the disclosure. FIG. 12 may show $S_{21}$ simulation results for 1.5 GHz, 2 GHz and 2.5 GHz with 6 gain-steps.

FIG. 12 shows $S_{21}$ simulation results for 6 gain-modes, which are controlled by a feedback circuit, e.g. the RFB-SFB, and switchable capacitors. All gain-steps are well or even excellent centered for the wanted operating frequency. By changing e.g. only the off-chip matching, this LNA can be matched for different frequency bands. In this example/figure, the LNA is matched with 3 different matching inductors to 1.5 GHz, 2 GHz and 2.6 GHz, achieving approximately equal or even equal power gain with a low or even ultra-low gain variation of +/−0.1 dB. This example shows the good or even excellent RF-performance over frequency of gain-step concepts according to embodiments, which can be used for multiple frequency bands to reduce developing cycles by designing only one RFFE LNA-core for different operating frequencies changing only the input matching inductor.

Figure 13:
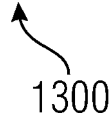
FIG. 13 shows a block diagram of a method according to embodiments of the disclosure.

FIG. 13 shows a block diagram of a method according to embodiments of the disclosure. Method 1300 is a method for adjusting a gain mode of a RF amplifier circuit, the RF amplifier circuit comprising an amplifier and a feedback circuit, wherein the feedback circuit comprises a resistive feedback circuit which is coupled between an input of the amplifier and an output of the amplifier, and a shunt feedback circuit which is coupled between the output of the amplifier and a reference input. Furthermore, the resistive feedback circuit comprises a first set of serially coupled resistors and a first set of switches, wherein the first set of resistors and the first set of switches are arranged in a ladder structure in which each switch of the first set of switches is configured to bypass one of the resistors of the first set of resistors in a closed state thereof. In addition, the shunt feedback circuit comprises a second set of serially coupled resistors and a second set of switches, wherein the second set of resistors and the second set of switches are arranged in a ladder structure in which each switch of the second set of switches is configured to bypass one of the resistors of the second set of resistors in a closed state thereof.

The method 1300 comprises providing control signals to the switches of the first and second set of switches in order to adjust the gain mode of the RF amplifier circuit.

Further Remarks

Embodiments according to the disclosure focus on a multi gain-step approach, which may deliver over different frequency bands (e.g. by only changing the external matching component) with low power gain (GMAX, $S_{21}$) variation. Also, an excellent linearity performance in every gain mode can be achieved. According to embodiments, the assumption may be made that $S_{22}$ is broadband or switchable and therefore matched for different frequency bands.

Embodiments, e.g. the feedback circuit according to embodiments may enable RFFE LNAs with a high amount of gain-steps (application specific requirements may now be fulfilled with one LNA design) with excellent sensitivity-on-demand and ultra-low gain variation in multiple frequency bands.

A fundamental idea according to embodiments may be to use a resistive feedback circuit, e.g. switchable resistive feedback (RFB), and a shunt feedback circuit, e.g. shunt feedback (SFB) circuit, to vary the power gain over a broad frequency range with excellent sensitivity-on-demand. To improve/center the input/power matching, e.g. for low gain modes, embodiments may comprise a switchable input capacitor.

This way of a gain-step circuit according to embodiments can be used for all LNAs (Bulk CMOS, SOI CMOS, Bipolar, and BiCMOS). The approach according to embodiments may, for example, be best suited for Bulk CMOS and SOI products. In other words, the amplifier according to embodiments may be one of a Bulk CMOS amplifier, a SOI CMOS amplifier, a Bipolar amplifier and/or a BiCMOS amplifier.

Switchable input capacitors according to embodiments may have a visible size and may be located closed to the RF input. Also, the RFB-SFB may have a visible size with for example needed poly resistors, RF-switches and decoupling capacitor. Furthermore, due to the gain-step model according to embodiments, it may not be necessary to use additional switchable circuits (e.g. like switchable source degeneration or tank inductor) which may enable or lead to a static LNA-core with best RF-performance in the HG mode.

In general, embodiments according to the disclosure may comprise or may provide systems and methods for a wide-band gain-step feature in CMOS LNAs.

In general, embodiments according to the disclosure may address or may be used within the technical areas of low noise amplifiers, LNAs, RF front-ends, CMOS, feedback structures, switchable circuitry and/or for or in application areas of RF front-ends, mobile and communication applications.

In general, embodiments according to the disclosure may be used for applications in which NF performance is important, such that high NF degradation may not be allowable. Furthermore, embodiments may provide a solution for multi gain-step amplifier problems in which only limited or small linearity headroom is available. Concepts according to embodiments, may, for example be used in User Equipment, UE, concepts, wherein chip size and power consumption limitations may be important. In other words, embodiments according to the disclosure may enable an equal gain attenuation over multiple frequency-bands for UE, using the variable gain functionality implemented in a LNA core. Embodiments comprise LNA-core gain-step concepts, which are centered on multiple frequency bands, e.g. from 6 dB to 18 dB. Normally narrowband RFFE LNAs may have to operate only at a single frequency band.

In the following, embodiments according to the disclosure are summarized.

Embodiments according to the disclosure comprise a radio frequency, RF, amplifier circuit comprising an amplifier and a feedback circuit. The feedback circuit comprises a resistive feedback circuit which is coupled between an input of the amplifier and an output of the amplifier and a shunt feedback circuit which is coupled between the output of the amplifier and a reference input. The resistive feedback circuit comprises a first set of serially coupled resistors and a first set of switches, wherein the first set of resistors and the first set of switches are arranged in a ladder structure in which each switch of the first set of switches is configured to bypass one of the resistors of the first set of resistors in a closed state thereof. Furthermore, the shunt feedback circuit comprises a second set of serially coupled resistors and a second set of switches, wherein the second set of resistors and the second set of switches are arranged in a ladder structure in which each switch of the second set of switches is configured to bypass one of the resistors of the second set of resistors in a closed state thereof.

According to further embodiments of the disclosure, the feedback circuit comprises at least one of a first additional resistor which is serially coupled with the ladder structure of the resistive feedback circuit; a second additional resistor which is serially coupled with the ladder structure of the shunt feedback circuit; and a decoupling capacitor which is coupled between the output of the amplifier and each of the resistive feedback circuit and the shunt feedback circuit.

According to further embodiments of the disclosure, the RF amplifier circuit comprises a control circuit configured to apply control signals to the switches of the first and second set of switches to open and close the switches in order to change between different gain modes of the RF amplifier circuit.

According to further embodiments of the disclosure, the control circuit is configured to apply a common control signal to switches of respective pairs of switches, each pair comprising one of the switches of the first set of switches and one of the switches of the second set of switches. Furthermore, the control circuit is configured to control all switches of the first and second set of switches to be in an open state in a first gain mode, and to control the switches of a number of the pairs of switches to be in the closed state in a second gain mode having a reduced gain when compared to the first gain mode.

According to further embodiments of the disclosure, the RF amplifier circuit comprises a disable switch circuit, wherein the disable switch circuit comprises a first and a second disable switch. The first disable switch is serially coupled with the resistive feedback circuit and configured to disconnect the feedback circuit from the input of the amplifier. Furthermore, the second disable switch is coupled between the output of the amplifier and each of resistive feedback circuit and the shunt feedback circuit and the second disable switch is configured to disconnect the feedback circuit from the output of the amplifier. Moreover, the control circuit is configured to control the disable switch circuit to disconnect the feedback circuit from the amplifier in a gain mode having the highest gain.

According to further embodiments of the disclosure, the RF amplifier circuit comprises at least N gain modes; wherein the control circuit is configured to provide, in a $0^{th}$ gain mode, having the highest gain, of the RF amplifier circuit, a common control signal to the first and second disable switch of the disable switch circuit, such that feedback circuit is disconnected from the amplifier. Furthermore, the control circuit is configured to provide, in a $x^{th}$, $x \in \{1, \ldots, N-1\}$, gain mode, having a lower gain with increasing order x, control signals to the first and second disable switch and to the switches of the first and second set of switches, such that the first and second disable switch are closed, such that $x-1$ pairs of switches of the first and second set of switches are closed and such that the remaining switches of the first and second set of switches are open.

According to further embodiments of the disclosure, the RF amplifier circuit comprises a switchable capacitor circuit between an input of the RF amplifier circuit and the amplifier, wherein the switchable capacitor circuit is configured to provide at least two different capacitances in two different gain modes.

According to further embodiments of the disclosure, a or the control circuit is configured to provide a control signal to the switchable capacitor circuit in order to reduce an input capacitance of the amplifier when the RF amplifier circuit is in a gain mode having a low gain.

According to further embodiments of the disclosure, the amplifier comprises at least one of a cascode, wherein the cascode comprises a common-source stage and a common-gate stage, wherein the drain of the common-source stage is coupled with the source of the common gate stage, and wherein the feedback circuit is coupled with the gate of the common-source stage and with the drain of the common-gate stage; a cascode, wherein the cascode comprises a common-emitter stage and a common-base stage, wherein the collector of the common-emitter stage is coupled with the emitter of the common base stage, and wherein the feedback circuit is coupled with the base of the common-emitter stage and with the collector of the common-base stage; a common-source stage; a common emitter stage; a stage with source degeneration; a stage with a switchable source degeneration; a single cascode stage; and a dual cascode stage.

According to further embodiments of the disclosure, the RF amplifier circuit further comprises a tank circuit, wherein the tank circuit is coupled between an output of the RF amplifier circuit, a supply input of the RF amplifier circuit and the feedback circuit and/or the output of the amplifier. Furthermore, the tank circuit comprises a passive or an active tank load.

According to further embodiments of the disclosure, the RF amplifier circuit further comprises one or more electrostatic discharge, ESD, protections circuits, which are coupled between an input of the RF amplifier circuit and a reference input and/or between an output of the RF amplifier circuit and a reference input.

According to further embodiments of the disclosure, the RF amplifier circuit further comprises a matching element which is configured to match an input impedance of the matching element to an input impedance of the amplifier; wherein the matching element is an inductive off-chip matching element which is coupled between an input of the RF amplifier circuit and each of the feedback circuit and the input of the amplifier. Alternatively, the matching element is an inductive on-chip matching element which is coupled between the input of the RF amplifier circuit and each of the feedback circuit and the input of the amplifier, and/or which is coupled between the input of the amplifier and each of the feedback circuit and the input of the RF amplifier circuit.

According to further embodiments of the disclosure, the RF amplifier circuit comprises a plurality of inputs and a plurality of matching elements, wherein a matching element of the plurality of matching elements is coupled between a respective input of the RF amplifier circuit and the input of the amplifier and wherein respective inputs of the plurality of inputs are configured to be provided with respective RF signals comprising different frequencies or different frequency bands. Furthermore, a respective matching element is configured to match an input impedance of the respective matching element to an input impedance of the amplifier for a respective RF signal.

According to further embodiments of the disclosure, the RF amplifier circuit comprises a plurality of bandpass filters, wherein a respective bandpass filter is coupled between a respective input of the RF amplifier circuit and a respective matching element, and a respective bandpass filter is configured to pass a specific frequency range of an RF signal provided to a respective input of the RF amplifier circuit.

Further embodiments of the disclosure comprise a method for adjusting a gain mode of a RF amplifier circuit, the RF amplifier circuit comprising an amplifier and a feedback circuit, wherein the feedback circuit comprises a resistive feedback circuit which is coupled between an input of the amplifier and an output of the amplifier; and a shunt feedback circuit which is coupled between the output of the amplifier and a reference input; wherein the resistive feedback circuit comprises a first set of serially coupled resistors and a first set of switches, wherein the first set of resistors and the first set of switches are arranged in a ladder structure in which each switch of the first set of switches is configured to bypass one of the resistors of the first set of resistors in a closed state thereof; and wherein the shunt feedback circuit comprises a second set of serially coupled resistors and a second set of switches, wherein the second set of resistors and the second set of switches are arranged in a ladder structure in which each switch of the second set of switches is configured to bypass one of the resistors of the second set of resistors in a closed state thereof. The method comprises providing control signals to the switches of the first and second set of switches in order to adjust the gain mode of the RF amplifier circuit.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the disclosure can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the disclosure comprise a data carrier having electronically readable control signals, which are capable of cooperating with a programmable computer system, such that one of the methods described herein is performed.

Generally, embodiments of the present disclosure can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the method is, therefore, a computer program having a program code for performing one of the methods described herein, when the computer program runs on a computer.

A further embodiment of the methods is, therefore, a data carrier (or a digital storage medium, or a computer-readable medium) comprising, recorded thereon, the computer program for performing one of the methods described herein.

A further embodiment of the method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of embodiments of the present disclosure. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. An RF amplifier circuit, comprising:

an amplifier; and a feedback circuit, the feedback circuit comprising:

a resistive feedback circuit having a first node coupled to an input of the amplifier and a second node coupled to an output of the amplifier, the resistive feedback circuit forming a first circuit path in which a first current is configured to flow between the input of the amplifier and the output of the amplifier; and a shunt feedback circuit having a first node coupled to the output of the amplifier and to the second node of the resistive feedback circuit, and a second node coupled to a reference input, the shunt feedback circuit forming a second circuit path in which a second current is configured to flow between the output of the amplifier and the reference input without flowing through the first circuit path;

wherein the resistive feedback circuit comprises a first set of serially coupled resistors and a first set of switches, wherein the first set of serially coupled resistors and the first set of switches are arranged in a ladder structure in which each switch of the first set of switches is configured to bypass one of the resistors of the first set of serially coupled resistors in a closed state thereof; and wherein the shunt feedback circuit comprises a second set of serially coupled resistors and a second set of switches, wherein the second set of serially coupled resistors and the second set of switches are arranged in a ladder structure in which each switch of the second set of switches is configured to bypass one of the resistors of the second set of serially coupled resistors in a closed state thereof.

2. The RF amplifier circuit according to claim 1, wherein the feedback circuit comprises at least one of:

a first additional resistor serially coupled with the ladder structure of the resistive feedback circuit;

a second additional resistor serially coupled with the ladder structure of the shunt feedback circuit; or a decoupling capacitor coupled between the output of the amplifier and each of the resistive feedback circuit and the shunt feedback circuit.

3. The RF amplifier circuit according to claim 1, further comprising a control circuit configured to apply control signals to the switches of the first and second sets of switches to open and close the switches in order to change between different gain modes of the RF amplifier circuit.

4. The RF amplifier circuit according to claim 3, wherein:

the control circuit is configured to apply a common control signal to switches of respective pairs of switches, each pair comprising one of the switches of the first set of switches and one of the switches of the second set of switches; and the control circuit is configured to cause all switches of the first and second sets of switches to be in an open state in a first gain mode, and to cause the switches of a number of the pairs of switches to be in the closed state in a second gain mode having a reduced gain when compared to the first gain mode.

5. The RF amplifier circuit according to claim 3, further comprising a disable switch circuit, wherein:

the disable switch circuit comprises a first and a second disable switch;

the first disable switch is serially coupled with the resistive feedback circuit and configured to disconnect the feedback circuit from the input of the amplifier;

the second disable switch is coupled between the output of the amplifier and each of the resistive feedback circuit and the shunt feedback circuit; the second disable switch is configured to disconnect the feedback circuit from the output of the amplifier; and the control circuit is configured to control the disable switch circuit to disconnect the feedback circuit from the amplifier in a gain mode having a highest gain.

6. The RF amplifier circuit according to claim 5, wherein:

the RF amplifier circuit comprises at least N gain modes;

the control circuit is configured to provide, in a oth gain mode, having a highest gain, of the RF amplifier circuit, a common control signal to the first and second disable switches of the disable switch circuit, such that feedback circuit is disconnected from the amplifier; and the control circuit is configured to provide, in a xth, $x \in \{1, \ldots, N-1\}$, gain mode, having a lower gain with increasing order x, control signals to the first and second disable switches and to the switches of the first and second set of switches, such that the first and second disable switches are closed, such that x-1 pairs of switches of the first and second set of switches are closed and such that the remaining switches of the first and second set of switches are open.

7. The RF amplifier circuit according to claim 1, further comprising a switchable capacitor circuit coupled between an input of the RF amplifier circuit and the amplifier, wherein the switchable capacitor circuit is configured to provide at least two different capacitances in two different gain modes.

8. The RF amplifier circuit according to claim 7, wherein a control circuit is configured to provide a control signal to the switchable capacitor circuit in order to reduce an input capacitance of the amplifier when the RF amplifier circuit is in a gain mode having a low gain.

9. The RF amplifier circuit according to claim 1, wherein the amplifier comprises at least one of:

a cascode, wherein the cascode comprises a common-source stage and a common-gate stage, wherein a drain of the common-source stage is coupled with a source of the common-gate stage, and wherein the feedback circuit is coupled with a gate of the common-source stage and with a drain of the common-gate stage;

a cascode, wherein the cascode comprises a common-emitter stage and a common-base stage, wherein a collector of the common-emitter stage is coupled with an emitter of the common-base stage, and wherein the feedback circuit is coupled with a base of the common-emitter stage and with a collector of the common-base stage;

a common-source stage;

a common-emitter stage;

a stage with source degeneration;

a stage with a switchable source degeneration;

a single cascode stage; or a dual cascode stage.

10. The RF amplifier circuit according to claim 1, the RF amplifier circuit further comprising:

a tank circuit, wherein the tank circuit is coupled between an output of the RF amplifier circuit, a supply input of the RF amplifier circuit and the feedback circuit or the output of the amplifier, wherein the tank circuit comprises a passive tank load or an active tank load.

11. The RF amplifier circuit according to claim 1, the RF amplifier circuit further comprising:

one or more electrostatic discharge (ESD) protection circuits coupled between an input of the RF amplifier circuit and a reference input or between an output of the RF amplifier circuit and a reference input.

12. The RF amplifier circuit according to claim 1, further comprising:

a matching element configured to match an input impedance of the matching element to an input impedance of the amplifier, wherein:

the matching element is an inductive off-chip matching element coupled between an input of the RF amplifier circuit and each of the feedback circuit and the input of the amplifier, or the matching element is an inductive on-chip matching element coupled between the input of the RF amplifier circuit and each of the feedback circuit and the input of the amplifier or coupled between the input of the amplifier and each of the feedback circuit and the input of the RF amplifier circuit.

13. The RF amplifier circuit according to claim 12, wherein:

the RF amplifier circuit comprises a plurality of inputs and a plurality of matching elements, wherein a matching element of the plurality of matching elements is coupled between a respective input of the RF amplifier circuit and the input of the amplifier;

respective inputs of the plurality of inputs are configured to be provided with respective RF signals comprising different frequencies or different frequency bands; and a respective matching element is configured to match an input impedance of the respective matching element to an input impedance of the amplifier for a respective RF signal.

14. The RF amplifier circuit according to claim 13, wherein:

the RF amplifier circuit comprises a plurality of bandpass filters, wherein a respective bandpass filter is coupled between a respective input of the RF amplifier circuit and a respective matching element; and each respective bandpass filter is configured to pass a specific frequency range of an RF signal provided to a respective input of the RF amplifier circuit.

15. A method for adjusting a gain mode of an RF amplifier circuit, the RF amplifier circuit comprising an amplifier and a feedback circuit, wherein the feedback circuit comprises:

a resistive feedback circuit having a first node coupled to an input of the amplifier and a second node coupled to an output of the amplifier, the resistive feedback circuit forming a first circuit path in which a first current is configured to flow between the input of the amplifier and the output of the amplifier; and a shunt feedback circuit having a first node coupled to the output of the amplifier and to the second node of the resistive feedback circuit, and a second node coupled to a reference input, the shunt feedback circuit forming a second circuit path in which a second current is configured to flow between the output of the amplifier and the reference input without flowing through the first circuit path;

wherein the resistive feedback circuit comprises a first set of serially coupled resistors and a first set of switches, wherein the first set of serially coupled resistors and the first set of switches are arranged in a ladder structure in which each switch of the first set of switches is configured to bypass one of the resistors of the first set of serially coupled resistors in a closed state thereof;

wherein the shunt feedback circuit comprises a second set of serially coupled resistors and a second set of switches, wherein the second set of serially coupled resistors and the second set of switches are arranged in a ladder structure in which each switch of the second set of switches is configured to bypass one of the resistors of the second set of serially coupled resistors in a closed state thereof; and wherein the method comprises:

providing control signals to the switches of the first and second sets of switches in order to adjust the gain mode of the RF amplifier circuit.

16. An RF amplifier circuit, comprising:

an amplifier;

a feedback circuit including:

a resistive feedback circuit having a first node coupled to an input of the amplifier and a second node coupled to an output of the amplifier, the resistive feedback circuit forming a first circuit path in which a first current is configured to flow between the input of the amplifier and the output of the amplifier, the resistive feedback circuit including a first set of serially coupled resistors and a first set of switches, each switch of the first set of switches configured to bypass one of the resistors of the first set of serially coupled resistors, and a shunt feedback circuit having a first node coupled to the output of the amplifier and to the second node of the resistive feedback circuit, and a second node coupled to a reference input, the shunt feedback circuit forming a second circuit path in which a second current is configured to flow between the output of the amplifier and the reference input without flowing through the first circuit path, the shunt feedback circuit including a second set of serially coupled resistors and a second set of switches, each switch of the second set of switches configured to bypass one of the resistors of the second set of serially coupled resistors; and a control circuit configured to apply control signals to the first and second sets of switches to open and close the switches and control gain modes of the RF amplifier circuit.

17. The RF amplifier circuit according to claim 16, wherein the control signals include a common control signal applied to each of respective pairs of switches in the first and second sets of switches.

18. The RF amplifier circuit according to claim 16, further comprising a disable switch circuit including a first disable switch serially coupled with the resistive feedback circuit and a second disable switch coupled between the output of the amplifier and each of the resistive feedback circuit and the shunt feedback circuit.

19. The RF amplifier circuit according to claim 18, wherein the control circuit is configured to control the disable switch circuit to disconnect the feedback circuit from the amplifier in a gain mode having a highest gain.

20. The RF amplifier circuit according to claim 16, further comprising a switchable capacitor circuit coupled between the input of the amplifier and an input of the RF amplifier circuit.

* * * * *